(12) United States Patent
Okumura

(10) Patent No.: US 7,038,241 B2
(45) Date of Patent: May 2, 2006

(54) CHANNEL-ETCH THIN FILM TRANSISTOR

(75) Inventor: Hiroshi Okumura, Tokyo (JP)

(73) Assignee: NEC LCD Technologies, LTD, Kanagawa (JP)

(*) Notice: Subject to any disclaimer, the term of this patent is extended or adjusted under 35 U.S.C. 154(b) by 0 days.

(21) Appl. No.: 11/017,075

(22) Filed: Dec. 21, 2004

(65) Prior Publication Data
US 2005/0104128 A1    May 19, 2005

Related U.S. Application Data

(62) Division of application No. 10/369,756, filed on Feb. 21, 2003, now Pat. No. 6,858,867.

(30) Foreign Application Priority Data

Feb. 22, 2002  (JP) .............................. 2002-045686

(51) Int. Cl.
H01L 29/04    (2006.01)
H01L 31/036   (2006.01)
H01L 31/0376  (2006.01)
H01L 31/20    (2006.01)

(52) U.S. Cl. .............................. 257/59; 257/66; 257/72; 257/347

(58) Field of Classification Search ................ 257/57, 257/59, 66, 72, 347
See application file for complete search history.

(56) References Cited

U.S. PATENT DOCUMENTS

| | | | |
|---|---|---|---|
| 5,875,009 A | | 2/1999 | Shibahara |
| 6,081,307 A | * | 6/2000 | Ha .............................. 349/40 |
| 6,707,107 B1 | | 3/2004 | Kido |

FOREIGN PATENT DOCUMENTS

| | | |
|---|---|---|
| JP | 61-259565 A | 11/1986 |
| JP | 4-360583 A | 12/1992 |
| JP | 7-273333 A | 10/1995 |
| JP | 1999-16188 A | 3/1999 |
| JP | 1999-32427 A | 5/1999 |
| JP | 1999-85789 A | 12/1999 |
| JP | 2001-308333 A | 11/2001 |

OTHER PUBLICATIONS

Y. Chen et al., "A Light-Shield a-Si TFT with Low Dark-Leakage Currents", The Institute of Electronics, Information and Communication Engineers, Technical Report of IEICE, EID98-216, (1999-03), pp. 85-88.

* cited by examiner

Primary Examiner—Thien F. Tran
(74) Attorney, Agent, or Firm—Sughrue Mion, PLLC

(57) ABSTRACT

A channel-etch thin film transistor having a source electrode including a source electrode primary portion and a source electrode lead portion and a drain electrode including a drain electrode primary portion and a drain electrode lead portion. At least one of the source electrode lead portion and the drain electrode lead portion has a side-contact portion in contact directly with a side wall of the active layer. An averaged width of the side-contact portion is narrower than an averaged width of corresponding one of the source electrode primary portion and the drain electrode primary portion.

16 Claims, 30 Drawing Sheets

CHANNEL-ETCH THIN FILM TRANSISTOR

This is a divisional of application Ser. No. 10/369,756 filed Feb. 21, 2003 now U.S. Pat. No. 6,858,867.

BACKGROUND OF THE INVENTION

1. Field of the Invention

The present invention relates to a channel-etch thin film transistor, and more particularly to a reverse-stagger channel-etch thin film transistor as a switching device for each pixel of an active matrix liquid crystal display.

All of patents, patent applications, patent publications, scientific articles and the like, which will hereinafter be cited or identified in the present application, will, hereby, be incorporated by references in their entirety in order to describe more fully the state of the art, to which the present invention pertains.

2. Description of the Related Art

In recent years, the importance of development of an active matrix liquid crystal display has been on the increase. The active matrix liquid crystal display has thin film transistors over an insulative substrate, typically a glass substrate. Each of the thin film transistors is provided to control an electric filed to be applied to corresponding one of pixels of the active matrix liquid crystal display. Some types of the thin film transistor have an active layer which comprises amorphous silicon. Such thin film transistor including the amorphous silicon active layer has widely been used due to a relatively low process temperature, for example, about 300° C.

FIG. 1 is a fragmentary plan view of a conventional channel-etch thin film transistor generally used in the active matrix liquid crystal display. FIG. 2 is a fragmentary cross sectional elevation view taken along an X–X' line of FIG. 1. With reference to FIGS. 1 and 2, a structure of the conventional channel-etch thin film transistor will, hereinafter, be described. A gate electrode 2 of chromium (Cr) is selectively provided on an upper surface of a glass substrate 1. A gate insulation film 3 of silicon nitride ($SiN_x$) extends over the gate electrode 2 and the upper surface of the glass substrate 1, so that the gate electrode 2 is completely buried in the gate insulation film 3. An active layer 4 is selectively provided on an upper surface of the gate insulation film 3, so that the active layer 4 is positioned over the gate electrode 2. The active layer 4 comprises an undoped amorphous silicon. Source and drain layers 5 are selectively provided on top surfaces of the active layer 4. The source and drain layers 5 comprise a phosphorous-doped n+-type amorphous silicon. A source electrode 6 and a drain electrode 7 are further provided over the source and drain layers 5 and the upper surface of the gate insulation film 3 in the vicinity of the active layer 4, so that the source and drain electrodes 6 and 7 are contact directly with the source and drain layers 5 respectively. An inter-layer insulator 8 extends over the upper surface of the gate insulation film 3 as well as over the source and drain electrodes 6 and 7, and also within a gap between the source and drain electrodes 6 and 7 and the source and drain layers 5. The inter-layer insulator 8 comprises silicon nitride ($SiN_x$). The inter-layer insulator 8 has a via hole which reaches a part of an upper surface of a lead portion of the source electrode 6, wherein the lead portion of the source electrode 6 is contact with the upper surface of the gate insulation film 3. A pixel electrode 9 is also selectively provided which extends over the inter-layer insulator 8 and within the via hole, so that a part of the pixel electrode 9 is contact directly with the part of the upper surface of the lead portion of the source electrode 6, whereby the source electrode 6 is electrically connected to the pixel electrode 9. The pixel electrode 9 also extends over an upper surface of the inter-layer insulator 8. The pixel electrode 9 comprises indium tin oxide (ITO).

The liquid crystal display also has an opposite substrate which faces to the above-described substrate 1, which may be referred to as a thin film transistor substrate, wherein an opposite electrode is formed on the opposite substrate, so that the pixel electrode 9 of the thin film transistor substrate 1 is positioned opposite to the opposite electrode of the opposite substrate. Each pair of the pixel electrode 9 and the opposite electrode sandwiches a liquid crystal cell layer for applying an electric field to the liquid crystal cell layer. The opposite substrate also has a back-light unit.

FIGS. 3A through 3G are fragmentary cross sectional elevation views of the conventional channel-etch thin film transistors in sequential steps involved in a conventional fabrication process for fabricating the transistor shown in FIGS. 1 and 2. The fabrication process for fabricating the transistor shown in FIGS. 1 and 2 will further be described with reference to FIGS. 3A through 3I.

With reference to FIG. 3A, a chromium layer is deposited on a clean upper surface of a glass substrate 1 by a sputtering process and then selectively removed, so that a gate electrode 2 of chromium (Cr) is formed on the glass substrate 1.

With reference to FIG. 3B, sequential plasma enhanced chemical vapor deposition processes are taken place, so that a gate insulation film 3 of $SiN_x$ is deposited over the gate electrode 2 and the glass substrate 1, and an undoped amorphous silicon layer 4a is deposited on the gate insulation film 3, and further a phosphorous-doped n+-type amorphous silicon layer 5a is deposited on the undoped amorphous silicon layer 4a.

With reference to FIG. 3C, an anisotropic etching process, for example, a dry etching process is taken place to selectively remove the phosphorous-doped n+-type amorphous silicon layer 5a and the undoped amorphous silicon layer 4a, so that a patterned undoped amorphous silicon layer 4 and a patterned phosphorous-doped n+-type amorphous silicon layer 5 remain over the gate electrode 2.

With reference to FIG. 3D, a further sputtering process is carried out to deposit a chromium layer over the phosphorous-doped n+-type amorphous silicon layer 5 and the upper surface of the gate insulation film 3. Subsequently, the chromium layer is selectively removed by an isotropic etching process, for example, a wet etching process to form source and drain electrodes 6 and 7, respectively. A part of the upper surface of the phosphorous-doped n+-type amorphous silicon layer 5 is exposed through a gap between the source and drain electrodes 6 and 7.

With reference to FIG. 3E, an anisotropic etching process, for example, a dry etching process is carried out by use of the source and drain electrodes 6 and 7 as a mask, so that the phosphorous-doped n+-type amorphous silicon layer 5 under the gap between the source and drain electrodes 6 and 7 is selectively removed, and further the undoped amorphous silicon layer 4 is also selectively removed. The selectively removed phosphorous-doped n+-type amorphous silicon layer 5 act as phosphorous-doped n+-type amorphous silicon source and drain layers 5, while the selectively removed undoped amorphous silicon layer 4 acts as an active layer 4.

With reference to FIG. 3F, a plasma enhanced chemical vapor deposition process is taken place to form an inter-layer insulator 8 of $SiN_x$ which extends over the gate insulation film 3 and the source and drain electrodes 6 and 7 as well as within the gap between the source and drain electrodes 6 and 7. The inter-layer insulator 8 is then selectively removed to form a via hole which reaches a part of an upper surface of a lead portion of the source electrode 6, wherein the lead portion extends over the gate insulation film 3. The inter-layer insulator 8 is provided to protect the active layer 4.

With reference to FIG. 3G, a further more sputtering process is carried out to deposit an indium tin oxide layer over the inter-layer insulator 8 and within the via hole, so that a part of the indium tin oxide layer is contact directly with the part of the lead portion of the source electrode 6. The indium tin oxide layer is then selectively removed by an etching process to form a pixel electrode 9 which extends within the via hole and a part of the upper surface of the inter-layer insulator 8.

The following descriptions will focus on issues engaged with the conventional channel-etch thin film transistor.

In recent years, the requirement for increasing the brightness of the liquid crystal display has been on the increase. To comply with this requirement, an intensity of the back-light tends to be increased. In this circumstances, it becomes more important to suppress or reduce a light-off leak current of the thin film transistor. If a light or a photon emitted from the back light is incident into the active layer of the n-channel thin film transistor, then photo-carriers are generated by the photo-electric effect. The light-off leak current is generated with those photo-carriers, particularly holes moving through the channel region and the drain electrode. The light-off leak current causes a pixel potential drop which further causes undesired various phenomenons, for example, a reduction in brightness of the module, a reduction of the contrast, a display spot, and a flicker.

In the conventional channel etch thin film transistor shown in FIGS. 1 and 2, a width of the source and drain electrodes 6 and 7, which are positioned over the active layer 4, is equal to a width of the source and drain electrodes 6 and 7, which are positioned in contact with side walls of the active layer 4, provided that the term "length" is, hereby, defined to be a horizontal size in a first horizontal direction along the X–X' line of FIG. 1, while the term "width" is defined to be another horizontal size in a second horizontal direction perpendicular to the first horizontal direction or perpendicular to the X–X' line of FIG. 1. Namely, the entirety of the source electrode 6 has a uniform width, while the drain electrode 7, except for a lead portion extending over the gate insulation layer 3, also has a uniform width which is equal to the width of the source electrode 6. Electron-hole pairs are generated in the active layer 4 by the photo-electric effect. The holes as generated are blocked by the phosphorous-doped n+-type amorphous silicon layer 5, while the holes may move, as the light-off leak current, through a contact region between the side wall of the active layer and the drain electrode 7 and thus into the drain electrode 7. This means that the light-off leak current is increased.

It is disclosed in Japanese laid-open patent publication No. 7-273333 and by Y. E. Chen et al. in Technical Report Of IEICE EID98-216 (March 1999) that in order to reduce such light-off leak current through the side wall of the active layer, insulating films are formed on the side walls of the active layer. The later-mentioned literature further addresses that the insulating films provided on the side walls of the active layer is effective to suppress the conduction of the light-off leak current as generated in the active layer into the source or drain electrode. FIG. 4 is a fragmentary cross sectional elevation view of another conventional channel etch thin film transistor with insulating films on side walls of an active layer for suppressing the light-off leak current as generated in the active layer into the source or drain electrode. The conventional channel etch thin film transistor shown in FIG. 4 may be considered to be modified from the above-described conventional channel etch thin film transistor shown in FIGS. 1 and 2, wherein the conventional channel etch thin film transistor shown in FIG. 4 further includes insulating films 10 on side walls of the active layer 4, so that the side walls of the active layer 4 are separated by the insulating films 10 from the source and drain electrodes 6 and 7. The formation of the insulating films 10 does, however, need an additional high temperature process. FIG. 5 is a fragmentary cross sectional elevation view of the conventional channel etch thin film transistor in the additional step for forming the insulating films on the side walls of the active layer included in the conventional channel etch thin film transistor shown in FIG. 4. The additional step may be carried out following to the step shown in FIG. 3C. The above-mentioned Japanese laid-open patent publication No. 7-273333 discloses that side wall insulating films of $SiN_x$ is formed by a plasma enhanced chemical vapor deposition, which may be normally carried out at about 300° C., and subsequent dry etching process. The above-mentioned literature discloses that the side wall insulating films are formed by an anneal at 230° C. for a long time in an oxygen atmosphere. Those relatively high temperature heat treatments, for example, the plasma enhanced chemical vapor deposition and the anneal cause undesired drops of the throughput of the thin film transistors, and thus increase the manufacturing costs thereof.

Japanese patent No. 3223805 discloses a forward-stagger thin film transistor, wherein an amorphous silicon layer, a silicon nitride ($SiN_x$) layer and a chromium (Cr) layer are patterned at the same time when a gate line is patterned. Namely, the amorphous silicon layer, the silicon nitride ($SiN_x$) layer and the chromium (Cr) layer are formed with the same island pattern. This island-pattern allows undesired leakage of current from edge-faces of the islands, whereby the off-leak current is likely to flow from the pixel electrode through an edge portion of the gate line to the drain line. In order to solve this problem, a width of a lead line connecting between the source electrode and the pixel electrode is narrower than a width of the source electrode. This off-leak current is caused by the unique structure that the amorphous silicon layer, the silicon nitride ($SiN_x$) layer and the chromium (Cr) layer have the same pattern, even the side walls of the active layer are not contact with the source and drain electrodes. The last-mentioned Japanese patent is silent on any hole block layer of n+-type. Namely, the mechanism of allowing the off-leak current disclosed in the last-mentioned Japanese patent No. 3223805 is different from the above-described mechanism of allowing the light-off leak current through the contact region between the side wall of the active layer and the source or drain electrode.

Japanese laid-open patent publication No. 61-259565 discloses a reverse-stagger thin film transistor including plural source and drain electrodes over an amorphous silicon layer, wherein those source and drain electrodes have lead portions with a narrower width which are connected commonly to an input signal line and an output signal line, respectively. This Japanese publication No. 61-259565 does not disclose nor teach any hole block layer of n+-type, and also is silent on the reason why the lead portions are narrower than the source and drain electrodes over the amorphous silicon layer. This reverse-stagger thin film transistor is designed to cut off any defective one of the source and drain electrodes from the signal lines, so as to allow the remaining effective source and drain electrodes to operate or perform normally, wherein a short circuit formation between the gate electrode and the source or drain electrode may render the source or drain electrode defective. This Japanese publication No. 61-259565 does not disclose nor teach the light-off leak current.

In the above circumstances, the development of a novel channel etch thin film transistor free from the above problems is desirable.

SUMMARY OF THE INVENTION

Accordingly, it is an object of the present invention to provide a novel channel etch thin film transistor free from the above problems.

It is a further object of the present invention to provide a novel channel etch thin film transistor which is capable of reducing a light-off leak current with allowing a higher throughput than the conventional channel etch thin film transistor with the side wall insulation layers on the side walls of the active layer.

The present invention provides a channel-etch thin film transistor including: a gate electrode over a substrate; a gate insulation film extending over the gate electrode and the substrate; an active layer including a channel region over the gate insulation film; source and drain regions on the active layer; a source electrode connected with the source region, and the source electrode including a source electrode primary portion in contact with the source region and a source electrode lead portion extending from the source electrode primary portion; and a drain electrode connected with the drain region, and the drain electrode including a drain electrode primary portion in contact with the drain region and a drain electrode lead portion extending from the drain electrode primary portion, wherein at least one of the source electrode lead portion and the drain electrode lead portion has a side-contact portion in contact directly with a side wall of the active layer, and an averaged width of the side-contact portion is narrower than an averaged width of corresponding one of the source electrode primary portion and the drain electrode primary portion.

The present invention also provides a channel-etch thin film transistor including: a gate electrode over a substrate; a gate insulation film extending over the gate electrode and the substrate; an active layer including a channel region over the gate insulation film; source and drain regions on the active layer; a source electrode connected with the source region, and the source electrode including a source electrode primary portion in contact with the source region and a source electrode lead portion extending from the source electrode primary portion; and a drain electrode connected with the drain region, and the drain electrode including a drain electrode primary portion in contact with the drain region and a drain electrode lead portion extending from the drain electrode primary portion, wherein at least one of the source electrode and the drain electrode is separated from a side wall of the active layer by an inter-layer insulator.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
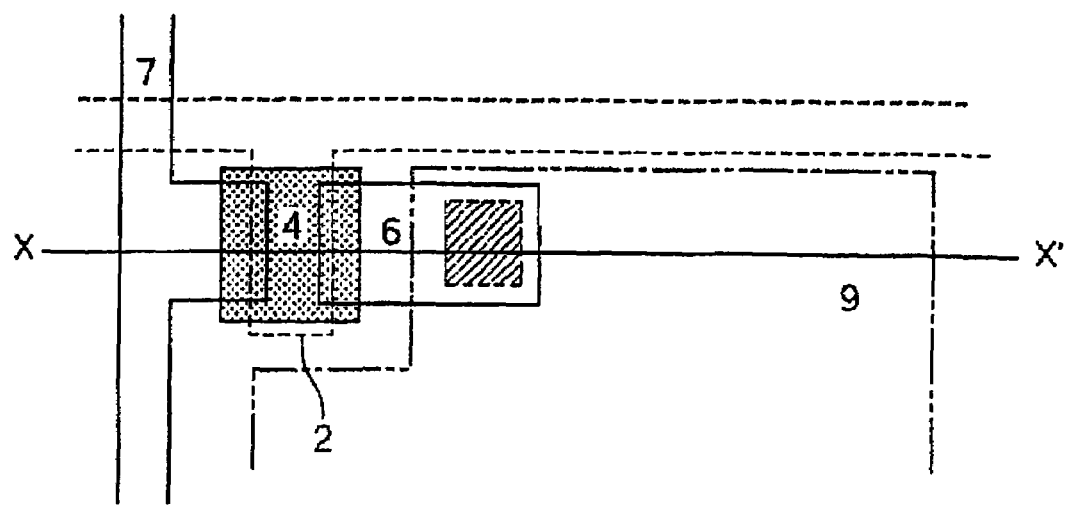
FIG. 1 is a fragmentary plan view of a conventional channel-etch thin film transistor generally used in the active matrix liquid crystal display.

A first aspect of the present invention is a channel-etch thin film transistor including: a gate electrode over a substrate; a gate insulation film extending over the gate electrode and the substrate; an active layer including a channel region over the gate insulation film; source and drain regions on the active layer; a source electrode connected with the source region, and the source electrode including a source electrode primary portion in contact with the source region and a source electrode lead portion extending from the source electrode primary portion; and a drain electrode connected with the drain region, and the drain electrode including a drain electrode primary portion in contact with the drain region and a drain electrode lead portion extending from the drain electrode primary portion, wherein at least one of the source electrode lead portion and the drain electrode lead portion has a side-contact portion in contact directly with a side wall of the active layer, and an averaged width of the side-contact portion is narrower than an averaged width of corresponding one of the source electrode primary portion and the drain electrode primary portion.

It is preferable that the side-contact portion is narrower in width than an end portion of the corresponding one of the source electrode primary portion and the drain electrode primary portion, and the end portion confronts counterpart one of the source electrode primary portion and the drain electrode primary portion.

It is preferable that each of the source electrode lead portion and the drain electrode lead portion has the side-contact portion in contact directly with the side wall of the active layer, and the averaged width of the side-contact portion is narrower than the averaged width of each of the source electrode primary portion and the drain electrode primary portion.

It is preferable that the source electrode primary portion and the drain electrode primary portion are symmetrical in view of plan view.

It is preferable that both of the source electrode lead portion and the drain electrode lead portion have side-contact portions in contact directly with the side walls of the active layer, and each of the side-contact portions is narrower than each of the source electrode primary portion and the drain electrode primary portion.

It is preferable that the source electrode primary portion and the drain electrode primary portion are asymmetrical in view of plan view.

It is preferable that the drain electrode lead portion has a side-contact portion in contact directly with the side wall of the active layer, the side-contact portion of the drain electrode lead portion is narrower than the drain electrode primary portion, and the source electrode primary portion is narrower than the drain electrode primary portion, and the source electrode lead portion has another side-contact portion having a width narrower than or equal to the source electrode primary portion.

It is preferable that at least one of the source electrode primary portion and the drain electrode primary portion has a wide region which has the same width as the end portion and a length of at least 3 micrometers along a channel length direction.

It is preferable that a peripheral edge of the gate electrode is positioned outside of a peripheral edge of the active layer in plan view.

It is preferable that the substrate comprises a glass substrate of a liquid crystal display, and the source electrode is connected to a pixel electrode, and the drain electrode is connected to a data line.

A second aspect of the present invention is a channel-etch thin film transistor including: a gate electrode over a substrate; a gate insulation film extending over the gate electrode and the substrate; an active layer including a channel region over the gate insulation film source and drain regions on the active layer; a source electrode connected with the source region, and the source electrode including a source electrode primary portion in contact with the source region and a source electrode lead portion extending from the source electrode primary portion; and a drain electrode connected with the drain region, and the drain electrode including a drain electrode primary portion in contact with the drain region and a drain electrode lead portion extending from the drain electrode primary portion, wherein at least one of the source electrode and the drain electrode is separated from a side wall of the active layer by an inter-layer insulator.

It is preferable that both of the source electrode and the drain electrode are separated from side walls of the active layer by an inter-layer insulator.

It is preferable that the source electrode lead portion comprises: a first source lead part extending over the inter-layer insulator and being connected through a first via hole to the source electrode primary portion; and a second source lead part extending under the inter-layer insulator and over the gate insulation film and being connected through a second via hole to the first source lead part and also being connected through a third via hole to a pixel electrode, and wherein the drain electrode lead portion comprises: a first drain lead part extending over the inter-layer insulator and being connected through a fourth via hole to the drain electrode primary portion; and a second drain lead part extending under the inter-layer insulator and over the gate insulation film and being connected through a fifth via hole to the first drain lead part and also being connected to a data line.

It is preferable that each of the first source lead part and the first drain lead part comprises a transparent and electrically connective material.

It is preferable that each of the source electrode primary portion and the drain electrode primary portion comprises a metal.

It is preferable that the source electrode lead portion comprises: a first via contact which connects the source electrode primary portion to a pixel electrode extending over the inter-layer insulator, and wherein the drain electrode lead portion comprises: a first drain lead part extending over the inter-layer insulator and being connected through a fourth via hole to the drain electrode primary portion; and a second drain lead part extending under the inter-layer insulator and over the gate insulation film and being connected through a fifth via hole to the first drain lead part and also being connected to a data line.

It is preferable that the first drain lead part comprises a transparent and electrically connective material.

It is preferable that each of the source electrode primary portion and the drain electrode primary portion comprises a metal.

It is preferable that one of the source electrode and the drain electrode is separated from side walls of the active layer by an inter-layer insulator.

It is preferable that the source electrode lead portion has a side-contact portion in contact directly with a side wall of the active layer, and wherein the drain electrode lead portion comprises: a first drain lead part extending over the inter-layer insulator and being connected through a fourth via hole to the drain electrode primary portion; and a second drain lead part extending under the inter-layer insulator and over the gate insulation film and being connected through a fifth via hole to the first drain lead part and also being connected to a data line.

It is preferable that the source electrode primary portion is narrower than the drain electrode primary portion, and the side-contact portion of the source electrode has a width narrower than or equal to the source electrode primary portion.

It is preferable that the first drain lead part comprises a transparent and electrically connective material.

It is preferable that each of the source electrode primary portion and the drain electrode primary portion comprises a metal.

It is preferable that at least one of the source electrode primary portion and the drain electrode primary portion has a wide region which has the same width as the end portion and a length of at least 3 micrometers along a channel length direction.

It is preferable that a peripheral edge of the gate electrode is positioned outside of a peripheral edge of the active layer in plan view.

It is preferable that the substrate comprises a glass substrate of a liquid crystal display, and the source electrode is connected to a pixel electrode, and the drain electrode is connected to a data line.

The following embodiments are typical examples for practicing the foregoing aspects of the present invention. Although the subject matters of the present invention have been described in details, the following additional descriptions in one or more typical preferred embodiments or examples will be made with reference to the drawings for making it easy to understand the typical modes for practicing the foregoing aspects of the present invention.

Figure 6:
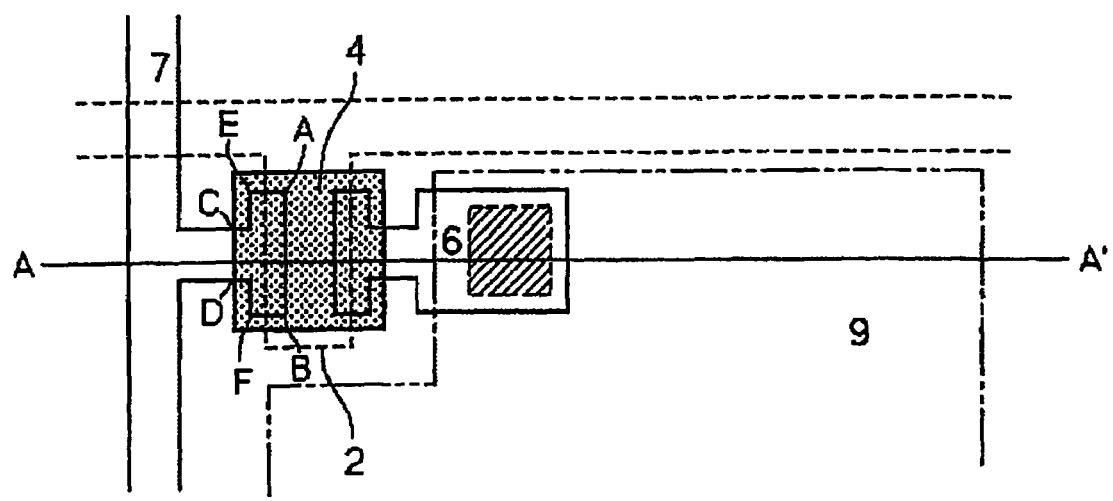
FIG. 6 is a fragmentary plan view of a novel channel-etch thin film transistor with improved source and drain electrodes in accordance with a first embodiment of the present invention.
Figure 7:
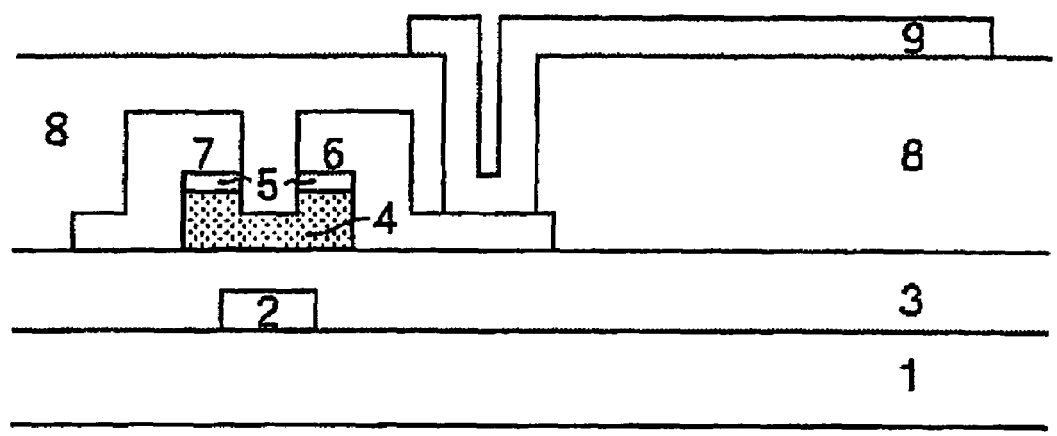
FIG. 7 is a fragmentary cross sectional elevation view taken along an A–A' line of FIG. 6.

First Embodiment:

A first embodiment according to the present invention will be described in detail with reference to the drawings. FIG. 6 is a fragmentary plan view of a novel channel-etch thin film transistor with improved source and drain electrodes in accordance with a first embodiment of the present invention. FIG. 7 is a fragmentary cross sectional elevation view taken along an A–A' line of FIG. 6. With reference to FIGS. 6 and 7, a structure of the novel channel-etch thin film transistor will, hereinafter, be described.

Figure 2:
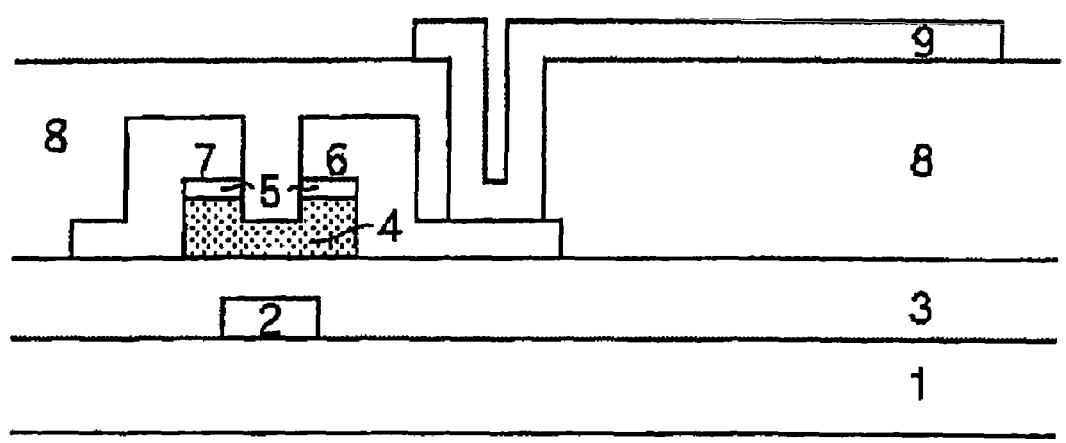
FIG. 2 is a fragmentary cross sectional elevation view taken along an X–X' line of FIG. 1.
Figure 3A:
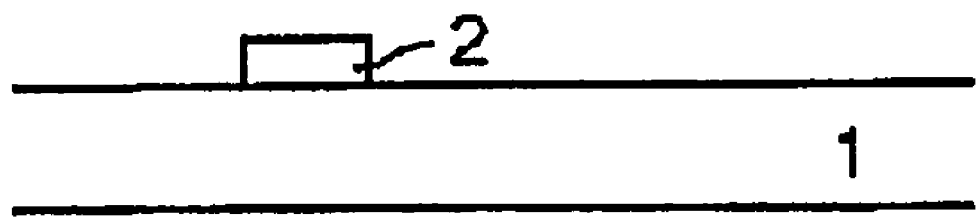
FIGS. 3A through 3G are fragmentary cross sectional elevation views of the conventional channel-etch thin film transistors in sequential steps involved in a conventional fabrication process for fabricating the transistor shown in FIGS. 1 and 2.
Figure 3B:
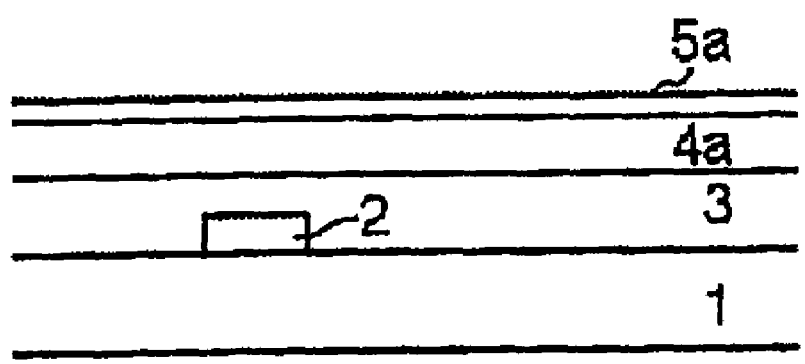
Figure 3C:
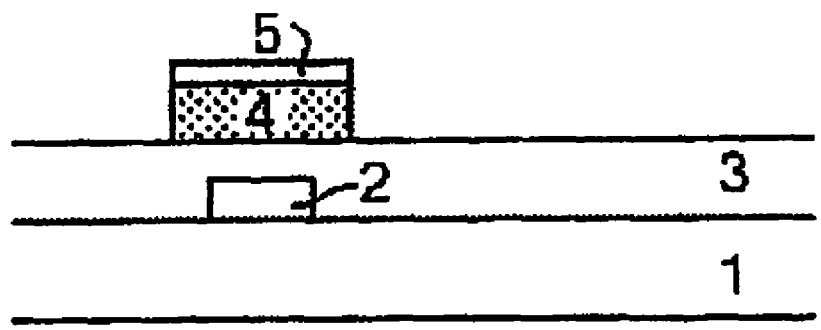
Figure 3D:
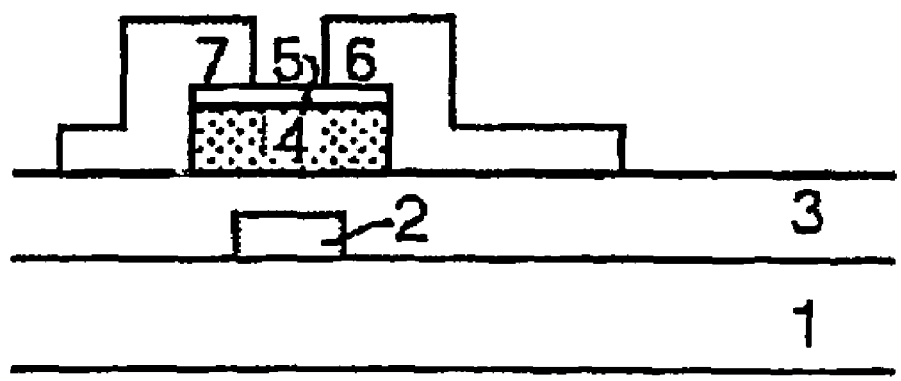
Figure 3E:
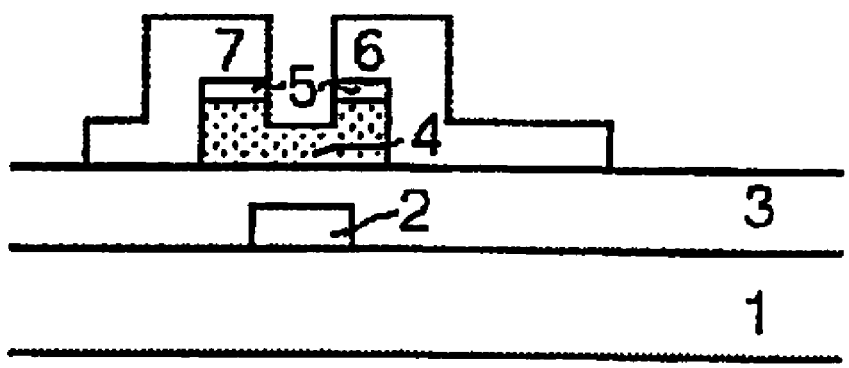
Figure 3F:
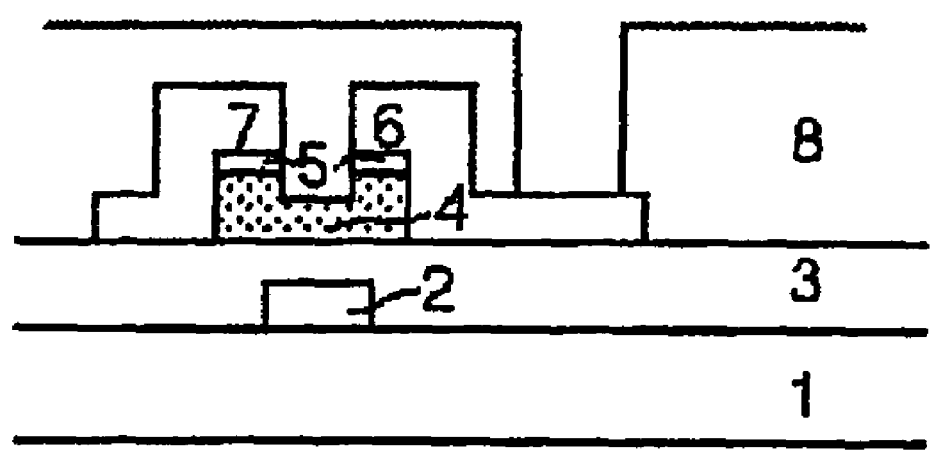
Figure 3G:
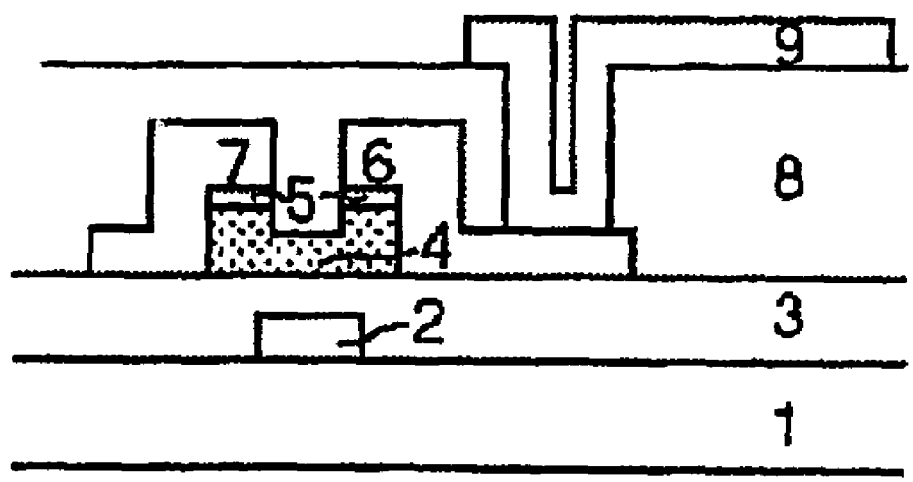

In summary, a structural difference between the novel channel-etch thin film transistor shown in FIGS. 6 and 7 in this first embodiment of the present invention and the conventional channel-etch thin film transistor shown in FIGS. 1 and 2 appears only on the plan shapes of the source and drain electrodes. Namely, there is no structural difference in the cross sectional elevation view in FIGS. 2 and 7.

In details, a gate electrode 2 of chromium (Cr) is selectively provided on an upper surface of a glass substrate 1. A gate insulation film 3 of silicon nitride ($SiN_x$) extends over the gate electrode 2 and the upper surface of the glass substrate 1, so that the gate electrode 2 is completely buried in the gate insulation film 3: An active layer 4 is selectively provided on an upper surface of the gate insulation film 3, so that the active layer 4 is positioned over the gate electrode 2. The active layer 4 comprises an undoped amorphous silicon. Source and drain layers 5 are selectively provided on top surfaces of the active layer 4. The source and drain layers 5 comprise a phosphorous-doped n+-type amorphous silicon. A source electrode 6 and a drain electrode 7 are further provided over the source and drain: layers 5 and the upper surface of the gate insulation film 3 in the vicinity of the active layer 4, so that the source and drain electrodes 6 and 7 are contact directly with the source and drain layers 5 respectively. An inter-layer insulator 8 extends over the upper surface of the gate insulation film 3 as well as over the source and drain electrodes 6 and 7, and also within a gap between the source and drain electrodes 6 and 7 and the source and drain layers 5. The inter-layer insulator 8 comprises silicon nitride ($SiN_x$). The inter-layer insulator 8 has a via hole which reaches a part of an upper surface of a lead portion of the source electrode 6, wherein the lead portion of the source electrode 6 is contact with the upper surface of the gate insulation film 3. A pixel electrode 9 is also selectively provided which extends over the inter-layer insulator 8 and within the via hole, so that a part of the pixel electrode 9 is contact directly with the part of the upper surface of the lead portion of the source electrode 6, whereby the source electrode 6 is electrically connected to the pixel electrode 9. The pixel electrode 9 also extends over an upper surface of the inter-layer insulator 8. The pixel electrode 9 comprises a transparent material, typically, indium tin oxide (ITO) or indium zinc oxide (IZO).

The source electrode 6 comprises a first part which extends over the active layer 4 and a second part which extends outside of the active layer 4 in the plan view. In FIG. 7, the first part of the source electrode 6 extends over a part of the top surface of the active layer 4, while the second part of the source electrode 6 extends in contact with the side wall of the active layer 4 and over the gate insulating film 3. In FIG. 6, the first part of the source electrode 6 overlaps the active layer 4, while the second part of the source electrode 6 is positioned in the right side of the active layer 4. The first and second parts of the source electrode 6 are continuous and united with each other. The first part of the source electrode 6 acts as the source electrode which provides a source potential. The second part of the source electrode 6 acts as a source lead which provides an electrical connection between the first part thereof and the pixel electrode 9 in the via hole.

The drain electrode 7 comprises a first part which extends over the active layer 4 and a second part which extends outside of the active layer 4 in the plan view. In FIG. 7, the first part of the drain electrode 7 extends over a part of the top surface of the active layer 4, while the second part of the drain electrode 7 extends in contact with the side wall of the active layer 4 and over the gate insulating film 3. In FIG. 6, the first part of the drain electrode 7 overlaps the active layer 4, while the second part of the drain electrode 7 is positioned in the left side of the active layer 4. The first and second parts of the drain electrode 7 are continuous and united with each other. The first part of the drain electrode 7 acts as the drain electrode which provides a drain potential. The second part of the drain electrode 7 acts as a drain lead which provides an electrical connection between the first part thereof and a data line.

The widths of the source and drain electrodes 6 and 7 are, hereby, defined to be a size or dimension thereof in a second horizontal direction perpendicular to a first horizontal direction along an A–A' line of FIG. 6. The first part of the source electrode 6 is distanced from the first part of the drain electrode 7 in the first horizontal direction.

As shown in FIG. 6, the first part of the source electrode 6 and the first part of the drain electrode 7 have the same pattern or the same shape in plan view. Further, the first part of the source electrode 6 and the first part of the drain electrode 7 are symmetrical in the plan view. The first part of the source electrode 6 has a first confronting side which is positioned closest to the first part of the drain electrode 7. The first part of the drain electrode 7 has a second confronting side which is positioned closest to the first part of the source electrode 6. The first and second confronting sides of the source and drain electrodes 6 and 7 confront to each other with an appropriate distance, and are aligned in parallel to each other and in the second horizontal direction.

As described above, the respective first parts of the source and drain electrodes 6 and 7 have the same pattern or shape in plan view. The pattern in plan view of each of the respective first parts of the source and drain electrodes 6 and 7 includes a wide-sub-part and a narrow-sub-part which is communicated with the second part. The wide-sub-part of the respective first parts of the source and drain electrodes 6 and 7 is rectangular-shaped by four corners "A", "B", "E" and "F" and has a wide-width defined by a distance between the corners "A" and "B" or between the corners "E" and "F". A width of each of the respective first parts of the source and drain electrodes 6 and 7 on the first and second confronting sides is defined to be the distance between the corners "A" and "B". The narrow-sub-part of the respective first parts of the source and drain electrodes 6 and 7 has a narrow-width defined by a distance between the corners "C" and "D" which is narrower than the wide-sub-part. The respective second parts of the source and drain electrodes 6 and 7 have the same narrow width as the narrow-sub-part of the respective first parts thereof. Namely, the respective second parts of the source and drain electrodes 6 and 7 in contact with the side walls of the active layer 4 are narrowed as compared to the respective wide-sub-parts of the source and drain electrodes 6 and 7 over the top surface of the active layer 4.

Consequently, it is important for the present invention that each of the source and drain electrodes 6 and 7 is so shaped or defined that each of the source and drain electrodes 6 and 7 has a side-contact lead part in contact directly with the side wall of the active layer 4, wherein the side-contact lead part in contact directly with the side wall of the active layer 4 is narrower than an electrode primary portion positioned over the active layer 4, which reduces a side contact area between each of the source and drain electrodes 6 and 7 and the active layer 4, whereby the reduced side-contact area suppresses an undesired leakage of current through the side wall of the active layer 4, namely the light-off leak current.

As described above, the side-contact lead part of each of the source and drain electrodes 6 and 7 is narrowed in order to reduce the above-described side contact area for suppressing the undesired leakage of current through the side wall of the active layer 4, even the side-contact lead part is in contact directly with the side wall of the active layer 4. Namely, the above structural feature is effective to suppress the undesired leakage of current through the side wall of the active layer 4, even any side wall insulation layer is not formed on the side walls of the active layer 4. No formation of any side wall insulation layer does not need to carry out any high temperature heat treatments, for example, the plasma enhanced chemical vapor deposition and the anneal, wherein such high temperature heat treatments cause undesired drops of the throughput of the thin film transistors, and thus increase the manufacturing costs thereof. Accordingly, the above structural feature is effective to suppress the undesired leakage of current through the side wall of the active layer 4, namely the light-off leak current, and to avoid any undesired drops of the throughput of the device and any undesired increase of the manufacturing costs thereof.

More precisely, it is important for the present invention that an averaged width of the side-contact lead part in contact directly with the side wall of the active layer 4 is narrower than an averaged width of the electrode primary portion positioned over the active layer 4, so as to reduce the side contact area between each of the source and drain electrodes 6 and 7 and the side walls of the active layer 4, whereby the reduced side-contact area suppresses an undesired leakage of current through the side wall of the active layer 4, namely the light-off leak current.

As described above, the electrode primary portions, which are positioned over the active layer 4, of the source and drain electrodes 6 and 7 are symmetrical as shown in FIG. 6. This symmetry in shape or pattern of the electrode primary portions renders it easy to design a driving current of the thin film transistor.

In this embodiment, one of the typical examples of the shape or pattern of the electrode primary portion of each of the source and drain electrodes 6 and 7 is rectangle as shown in FIG. 6, even this rectangle shape or pattern is optional. Any change in shape or pattern of the electrode primary portion of each of the source and drain electrodes 6 and 7 is available as long as, for each of the source and drain electrodes 6 and 7, the side-contact lead part in contact directly with the side wall of the active layer 4 is narrower than the electrode primary portion positioned over the active layer 4.

Any modification to the shape or pattern of the electrode primary portion of each of the source and drain electrodes 6 and 7 is available as long as, for each of the source and drain electrodes 6 and 7, the averaged width of the side-contact lead part in contact directly with the side-wall of the active layer 4 is narrower than the averaged width of the electrode primary portion positioned over the active layer 4. For example, the shape or pattern of the electrode primary portion of each of the source and drain electrodes 6 and 7 may be not rectangle. The dimension "AB" may not be equal to the dimension "EF". For example, the dimension "AB" may be either larger or smaller than the dimension "EF".

The effect of the present invention was demonstrated by the present inventor as follows. A first thin film transistor shown in FIG. 6 and with a channel length of 6 micrometers and a channel width "AB" of 24 micrometers and a side-contact lead part width "CD" of 4 micrometers was prepared, wherein the side-contact lead part in contact directly with the side wall of the active layer 4 has a width narrower than that of the electrode primary portion over the active layer 4. A light-off leak current was measured under the condition that a back light of a luminance of 5000 cd/m$^2$ was used. The measured light-off leak current was 6E-12 A.

As comparison, a second thin film transistor with a channel length of 6 micrometers and a channel width "AB" of 24 micrometers and a side-contact lead part width "CD" of 24 micrometers was prepared, wherein the side-contact lead part in contact directly with the side wall of the active layer 4 has the same width as the electrode primary portion over the active layer 4. A light-off leak current was measured under the condition that the back light of the luminance of 5000 cd/m$^2$ was used. The measured light-off leak current was 1E-11 A.

The measured light-off leak current value of the first thin film transistor is approximately 60% of the measured light-off leak current value of the second thin film transistor. This means that the narrowed side-contact lead part of the first thin film transistor causes an approximately 40% reduction of the light-off leak current as compared to the above wide side-contact lead part of the second thin film transistor.

It was also confirmed for the first thin film transistor that if a dimension in the first horizontal direction along A–A' line of the rectangle-shaped wide part of each of the source and drain electrodes 6 and 7, which is defined between points "A" and "E" in FIG. 6 is less than 3 micrometers, a contact characteristic between the source and drain layers 5 and the source and drain electrodes 6 and 7 tends to be deteriorated. The contact characteristic tends to be improved by increasing the contact area between the source and drain layers 5 and the source and drain electrodes 6 and 7. The increase in the contact area between the source and drain layers 5 and the source and drain electrodes 6 and 7 is also preferable to ensure a sufficient adhesion between the source and drain layers 5 and the source and drain electrodes 6 and 7. In the above viewpoints of both ensuring the good contact characteristic and the sufficient adhesion, it is preferable that the dimension "AE" in FIG. 6 is at least 3 micrometers.

As shown in FIG. 6, the gate electrode 2 extends so that a center region of the active layer 4 overlaps the gate electrode 2. A width of the gate electrode 2 is defined to be a dimension of the gate electrode 2 in the first horizontal direction along the A–A' line of FIG. 6. The gate electrode 2 has a width smaller than a dimension of the active layer 4 in the first horizontal direction along the A–A' line of FIG. 6. The gate electrode 2 overlapping the active layer 4 in the plan view provides a light shielding effect which reduces the light-off leak current. In order to obtain a further reduction of the light-off leak current; it is effective to increase or widen the width of the gate electrode 2, so that the gate electrode 2 overlaps, in the plan view, at least the entirety of the active layer 4 and preferably not only the entirety of the active layer 4 but also a surrounding region with a width of at least 3 micrometers which surrounds the periphery of the active layer 4.

Figure 8:
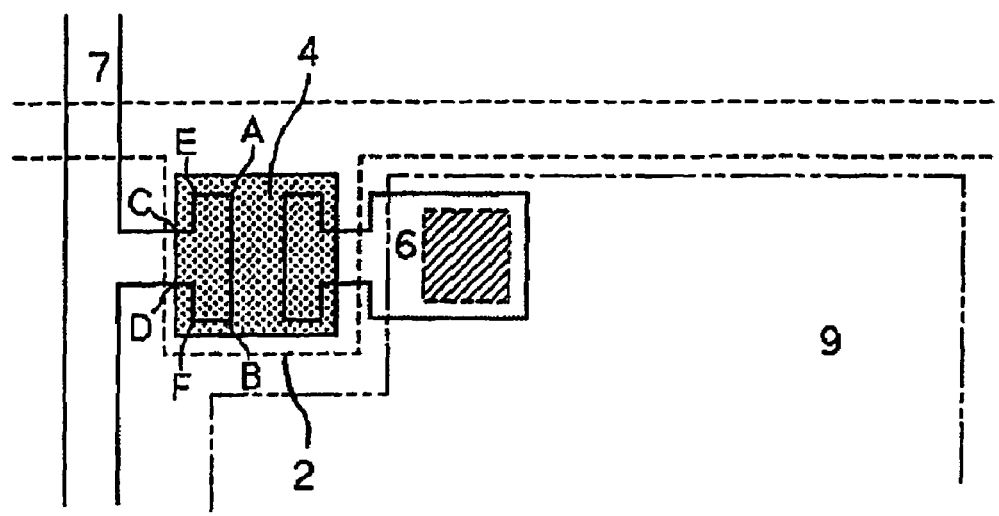
FIG. 8 is a fragmentary plan view of a novel channel-etch thin film transistor with improved source and drain electrodes in accordance with a first modification to the first embodiment of the present invention.

FIG. 8 is a fragmentary plan view of a novel channel-etch thin film transistor with improved source and drain electrodes in accordance with a first modification to the first embodiment of the present invention. The increased width of the gate electrode 2 is effective in order to obtain a further reduction of the light-off leak current. As shown in FIG. 8, the gate electrode 2 overlaps, in the plan view, at least the entirety of the active layer 4 and preferably not only the entirety of the active layer 4 but also a surrounding region which surrounds the periphery of the active layer 4, wherein the surrounding region has a width of at least 3 micrometers. If the width of the surrounding region overlapping the gate electrode 2 in the plan view is increased further from 3 micrometers, then no more reduction to the light-off leak current is obtained. Namely, it is unnecessary to increase the width of the surrounding region from 3 micrometers.

The effect of this first modification to the above-described first embodiment was demonstrated by the present inventor as follows. A third thin film transistor shown in FIG. 8 and with a channel length of 6 micrometers and a channel width "AB" of 24 micrometers and a side-contact lead part width "CD" of 4 micrometers was prepared, wherein the side-contact lead part in contact directly with the side wall of the active layer 4 has a width narrower than that of the electrode primary portion over the active layer 4 and further the gate electrode 2 overlaps, in the plan view, at least the entirety of the active layer 4 and preferably not only the entirety of the active layer 4 but also a surrounding region which surrounds the periphery of the active layer 4. A light-off leak current was measured under the condition that a back light of a luminance of 5000 cd/m$^2$ was used. The measured light-off leak current was 2E-12 A, which is lower than 6E-12 A of the first thin film transistor of the first embodiment and shown in FIG. 6. This demonstrates that the increase in the width of the active layer 4 is effective to reduce the light-off leak current.

Figure 9:
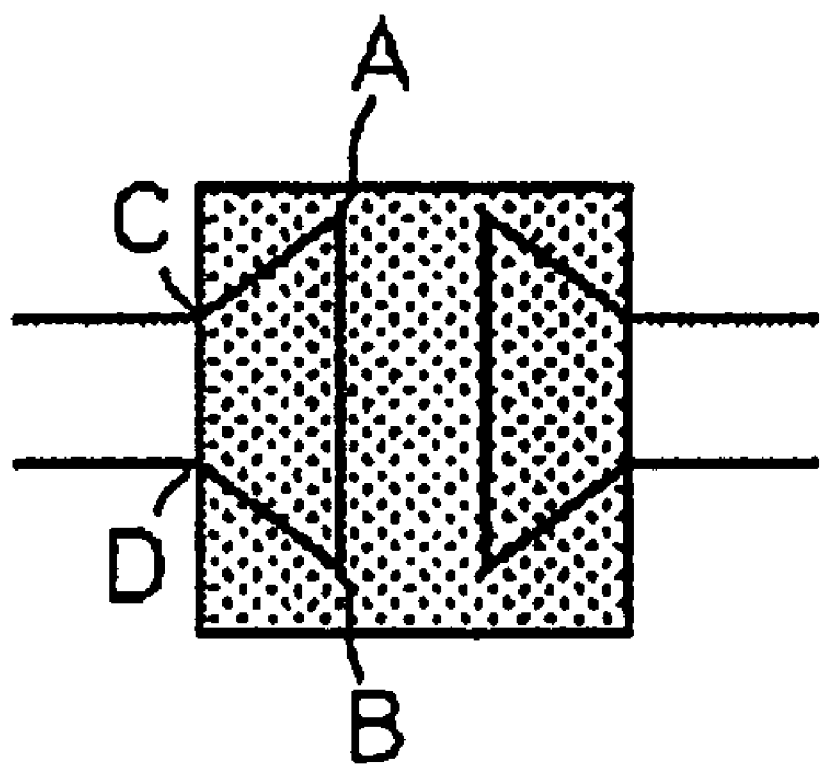
FIG. 9 is a fragmentary plan view of a modified shape or pattern of the electrode primary portions of the source and drain electrodes in a second modification to the first embodiment of the present invention.

As described above, any modification to the shape or pattern of the electrode primary portion of each of the source and drain electrodes 6 and 7 is available as long as, for each of the source and drain electrodes 6 and 7, the averaged width of the side-contact lead part in contact directly with the side wall of the active layer 4 is narrower than the averaged width of the electrode primary portion positioned over the active layer 4. FIG. 9 is a fragmentary plan view of a modified shape or pattern of the electrode primary portions of the source and drain electrodes in a second modification to the first embodiment of the present invention. As shown in FIG. 9, the electrode primary portions of the source and drain electrodes 6 and 7 may have a trapezoidal shape such that the dimension "AB" on the confronting side is larger than the other dimension "CD" on the edge of the active layer 4 or on the boundary between the electrode primary portion over the active layer 4 and the side-contact lead part in contact directly with the side wall of the active layer 4.

The width of the side-contact lead part in contact directly with the side wall of the active layer 4 is narrower than the width of the electrode primary portion over the active layer 4. Namely, the averaged width of the side-contact lead part in contact directly with the side wall of the active layer 4 is narrower than the averaged width of the electrode primary portion over the active layer 4, so as to reduce the side contact area between each of the source and drain electrodes 6 and 7 and the side walls of the active layer 4, whereby the reduced side-contact area suppresses an undesired leakage of current through the side wall of the active layer 4, namely the light-off leak current.

Further, the electrode primary portions, which are positioned over the active layer 4, of the source and drain electrodes 6 and 7 are symmetrical as shown in FIG. 9. This symmetry in shape or pattern of the electrode primary portions renders it easy to design a driving current of the thin film transistor.

Figure 10:
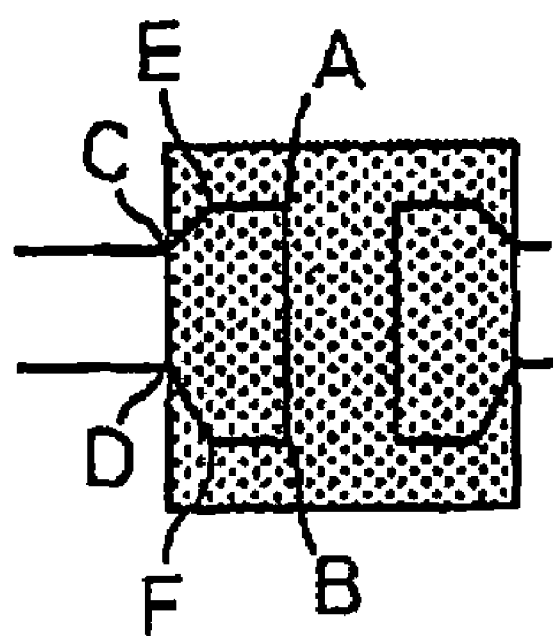
FIG. 10 is a fragmentary plan view of a further modified shape or pattern of the electrode primary portions of the source and drain electrodes in a third modification to the first embodiment of the present invention.

FIG. 10 is a fragmentary plan view of a further modified shape or pattern of the electrode primary portions of the source and drain electrodes in a third modification to the first embodiment of the present invention. As shown in FIG. 10, the electrode primary portions of the source and drain electrodes 6 and 7 may have a partly tapered general-rectangle shape. The dimension "AB" on the confronting side is equal to a dimension "EF" to form a rectangle-shaped part with four corners "A", "B", "C" and "D". These dimensions "AB" and "EF" are larger than the other dimension "CD" on the edge of the active layer 4 or on the boundary between the electrode primary portion over the active layer 4 and the side-contact lead part in contact directly with the side wall of the active layer 4 to form a tapered part with four corners "E", "F", "C" and "D".

The width of the side-contact lead part in contact directly with the side wall of the active layer 4 is narrower than the width of the electrode primary portion over the active layer 4. Namely, the averaged width of the side-contact lead part in contact directly with the side wall of the active layer 4 is narrower than the averaged width of the electrode primary portion over the active layer 4, so as to reduce the side contact area between each of the source and drain electrodes 6 and 7 and the side walls of the active layer 4, whereby the reduced side-contact area suppresses an undesired leakage of current through the side wall of the active layer 4, namely the light-off leak current.

Further, the electrode primary portions, which are positioned over the active layer 4, of the source and drain electrodes 6 and 7 are symmetrical as shown in FIG. 10. This symmetry in shape or pattern of the electrode primary portions renders it easy to design a driving current of the thin film transistor.

Figure 11:
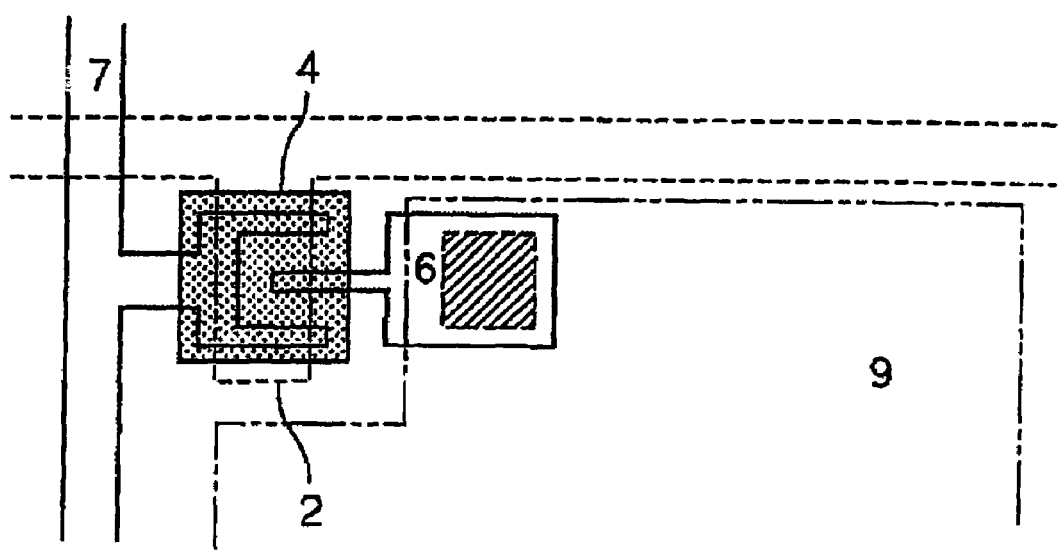
FIG. 11 is a fragmentary plan view of a further modified shape or pattern of the electrode primary portions of the source and drain electrodes in a fourth modification to the first embodiment of the present invention.

FIG. 11 is a fragmentary plan view of a further modified shape or pattern of the electrode primary portions of the source and drain electrodes in a fourth modification to the first embodiment of the present invention. The above shapes or patterns of the electrode primary portions of the source and drain electrodes 6 and 7 shown in FIGS. 6, 8, 9 and 10 are symmetrical. In contrast to the above first embodiment and the first to third modifications thereto, a modified shape or pattern of the electrode primary portions of the source and drain electrodes in this fourth modification is asymmetrical as shown in FIG. 11. The electrode primary portion, which is positioned over the active layer 4, of the source electrode 6 has a smaller area than that of the electrode primary portion, which is positioned over the active layer 4, of the drain electrode 7, in order to reduce a parasitic capacitance of the source electrode 6. The reduction in parasitic capacitance of the source electrode 6 improves a writing performance of the thin film transistor. In order to obtain a good contact characteristic of the source electrode 6, it is preferable that the electrode primary portion, which is positioned over the active layer 4, of the source electrode 6 has a sufficient length in the first horizontal direction. As shown in FIG. 11, the electrode primary portion of the source electrode 6 has a sufficiently narrow width. The side-contact lead part of the source electrode 6 may have the same narrow width as the electrode primary portion thereof. Namely, the side-contact lead part and the electrode primary portion of the source electrode 6 have a uniform and narrow width. The narrow width of the side-contact lead part of the source electrode 6 reduces the side contact area between the side-contact lead part of the source electrode 6 and the side wall of the active layer 4, whereby the reduced side-contact area suppresses an undesired leakage of current through the side wall of the active layer 4, namely the light off-leak current.

In contrast to the source electrode 6, the drain electrode 7 has the electrode primary portion, which is positioned over the active layer 4, wherein the electrode primary portion of the drain electrode 7 has a U-shaped pattern which partly surrounds the electrode primary portion of the drain electrode 6 as shown in FIG. 11. The width of the U-shaped electrode primary portion of the drain electrode 7 is much wider than the narrow width of the electrode primary portion of the source electrode 6, so that the U-shaped electrode primary portion surrounds partly the electrode primary portion of the source electrode 6 with almost a constant distance between them. The side-contact lead part of the drain electrode 7 is narrower than the U-shaped electrode primary portion of the drain electrode 7. The narrow width of the side-contact lead part of the drain electrode 7 reduces the side contact area between the side-contact lead part of the source electrode 6 and the side wall of the active layer 4, whereby the reduced side-contact area suppresses an undesired leakage of current through the side wall of the active layer 4, namely the light off-leak current.

In this fourth modification to the first embodiment, only the side-contact lead part of the drain electrode 7 is narrowed as compared to the U-shaped electrode primary portion of the drain electrode 7, while the source electrode 6 has the uniform and narrow width over the electrode primary portion and the side-contact lead part.

As a modification, it is also possible that the narrow width of the side-contact lead part of the source electrode 6 may optionally be further reduced to be narrower than the narrow width of the electrode primary portion of the source electrode 6 in order to further reduce the side-contact area between the side-contact lead part of the source electrode 6 and the side wall of the active layer 4, whereby the reduced contact area suppresses an undesired leakage of current through the side wall of the active layer 4, namely the light off-leak current.

As described above, the electrode primary portion of the source electrode 6 has a smaller area than the electrode primary portion of the drain electrode 7. This is significant to reduce the parasitic capacitance of the source electrode 6 and improve the write performance of the thin film transistor.

Figure 4:
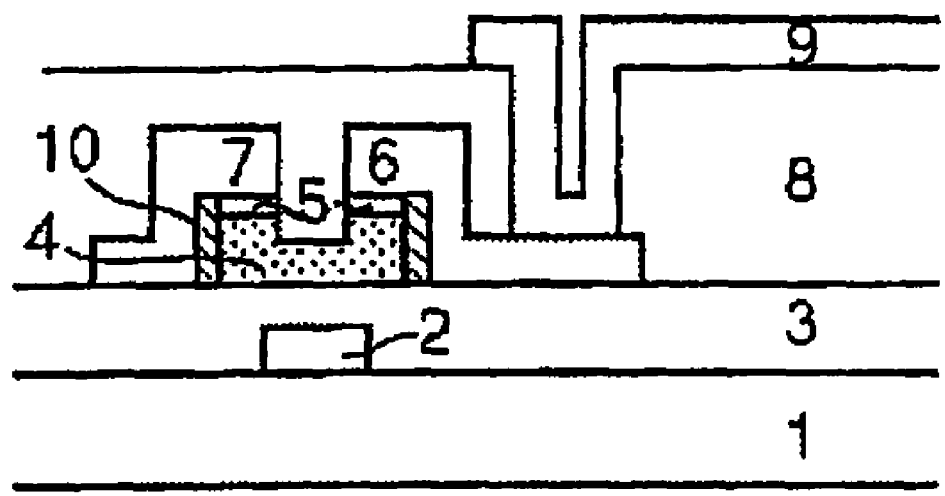
FIG. 4 is a fragmentary cross sectional elevation view of another conventional channel etch thin film transistor with insulating films on side walls of an active layer for suppressing the light-off leak current as generated in the active layer into the source or drain electrode.
Figure 5:
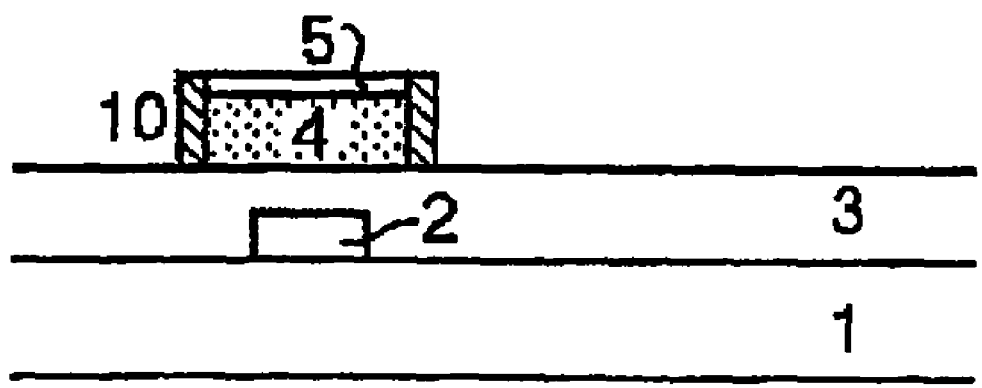
FIG. 5 is a fragmentary cross sectional elevation view of the conventional channel etch thin film transistor in the additional step for forming the insulating films on the side walls of the active layer included in the conventional channel etch thin film transistor shown in FIG. 4.

The above-described novel thin film transistors shown in FIGS. 6, 8, 9, 10 and 11 are different in only patterns of the source and drain electrodes 6 and 7 from the conventional thin film transistor shown in FIG. 1. Therefore, each of the above-described novel thin film transistors shown in FIGS. 6, 8, 9, 10 and 11 may be fabricated by the same manufacturing processes as shown in FIGS. 3A to 3G, expect for using the respective unique patterns for patterning the source and drain electrodes 6 and 7. Namely, it is unnecessary, for the above-described novel thin film transistors shown in FIGS. 6, 8, 9, 10 and 11, to form side wall insulation films on the side walls of the active layer 4 as shown in FIGS. 4 and 5. This means that each of the above-described novel thin film transistors shown in FIGS. 6, 8, 9, 10 and 11 with the reduced light-off leak current may be obtained without lowering the manufacturing throughput thereof.

Figure 12:
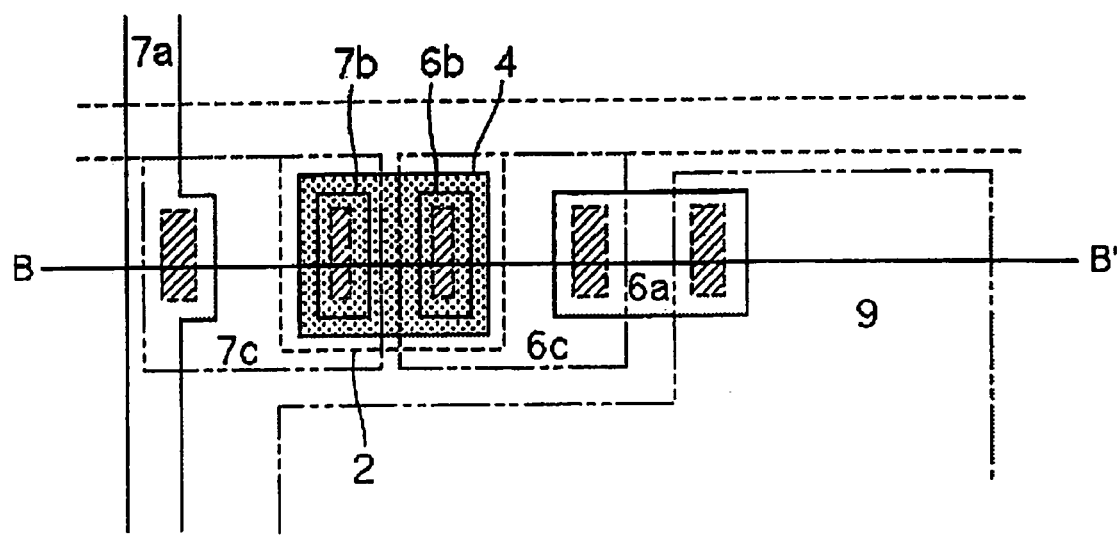
FIG. 12 is a fragmentary plan view of a novel channel-etch thin film transistor with improved source and drain electrodes in accordance with a second embodiment of the present invention.
Figure 13:
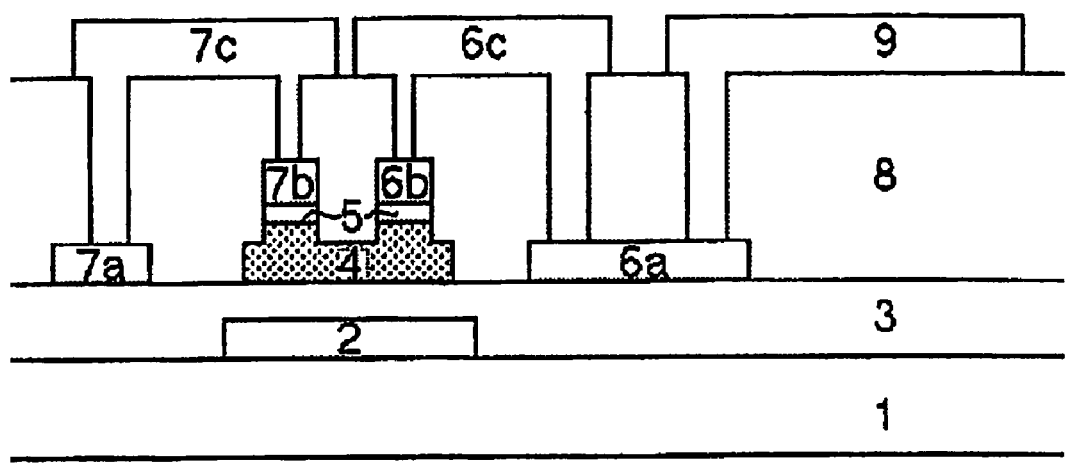
FIG. 13 is a fragmentary cross sectional elevation view taken along a B–B' line of FIG. 12.

Second Embodiment:

A second embodiment of the present invention will be described. FIG. 12 is a fragmentary plan view of a novel channel-etch thin film transistor with improved source and drain electrodes in accordance with a second embodiment of the present invention. FIG. 13 is a fragmentary cross sectional elevation view taken along a B–B' line of FIG. 12. With reference to FIGS. 12 and 13, a structure of the novel channel-etch thin film transistor will, hereinafter, be described.

In summary, a structural difference between the novel channel-etch thin film transistor shown in FIGS. 12 and 13 in this first embodiment of the present invention and the conventional channel-etch thin film transistor shown in FIGS. 1 and 2 appears on both the plan view and the cross sectional view of the source and drain electrodes. Each of the source and drain electrodes 6 and 7 extends in contact with the top surface of the active layer 4 but separated from the side walls of the active layer 4 by the inter-layer insulator 8. For example, each of the source and drain electrodes 6 and 7 extends from the top surface of the active layer 4 upwardly through a first source via hole, and further extends over a top surface of the inter-layer insulator 8 outwardly and through a second source via hole downwardly and extends under the inter-layer insulator 8 and over the gate insulating film 3, so that each of the source and drain electrodes 6 and 7 has no side contact area with the side walls of the active layer 4, while the side walls of the active layer 4 are in contact directly with the inter-layer insulator 8. No side contact area causes no leakage of current through the side wall of the active layer 4, namely causes a largely-reduced light off-leak current.

In details, a gate electrode 2 of chromium (Cr) is selectively provided on an upper surface of a glass substrate 1. A gate insulation film 3 of silicon nitride ($SiN_x$) extends over the gate electrode 2 and the upper surface of the glass substrate 1, so that the gate electrode 2 is completely buried in the gate insulation film 3. An active layer 4 is selectively provided on an upper surface of the gate insulation film 3, so that the active layer 4 is positioned over the gate electrode 2. The active layer 4 comprises an undoped amorphous silicon. Source and drain layers 5 are selectively provided on top surfaces of the active layer 4. The source and drain layers 5 comprise a phosphorous-doped n+-type amorphous silicon. A source electrode 6 and a drain electrode 7 are further provided, so that the source and drain electrodes 6 and 7 are separated from the side walls of the active layer 4. Details of the source and drain electrodes 6 and 7 will be described below. An inter-layer insulator 8 extends over the upper surface of the gate insulation film 3 as well as over parts of the source and drain electrodes 6 and 7, and also within a gap between the source and drain electrodes 6 and 7 and the source and drain layers 5. The inter-layer insulator 8 comprises silicon nitride ($SiN_x$). The inter-layer insulator 8 has first and second source via holes, and first and second drain via holes and further a pixel electrode via hole.

The source electrode 6 comprises a first lead portion 6a which extends over the gate insulating film 3, an electrode primary portion 6b which extends on the source layer 5, and a second lead portion 6c which extends over the inter-layer insulator 8 and within the first and second source via holes, wherein the second lead portion 6c is connected through the first source via hole to the first lead portion 6a and also connected through the second source via hole to the electrode primary portion 6b.

The drain electrode 7 comprises a first lead portion 7a which extends over the gate insulating film 3, an electrode primary portion 7b which extends on the drain layer 5, and a second lead portion 7c which extends over the inter-layer insulator 8 and within the first and second drain via holes, wherein the second lead portion 7c is connected through the first drain via hole to the first lead portion 7a and also connected through the second drain via hole to the electrode primary portion 7b.

Each of the source and drain electrodes 6 and 7 is connected to the top surface of the active layer 4 but is separated from the side walls of the active layer 4 by the inter-layer insulator 8, so that each of the source and drain electrodes 6 and 7 has no side contact area in contact with the side walls of the active layer 4. Namely, it may be considered that the each of the source and drain electrodes 6 and 7 has zero width of the side contact lead part in contact directly with the side wall of the active layer 4. No side contact area causes no leakage of current through the side walls of the active layer 4, namely a largely-reduced light-off leak current.

It is preferable that the second lead portions 6c and 7c of the source and drain electrodes 6 and 7 may comprise a transparent material, for example, indium tin oxide (ITO) and indium zinc oxide (IZO), which exhibits no reflection of a light emitted from the back-light, whereby a desired further reduction of the light-off leak current is obtained.

A pixel electrode 9 is also selectively provided which extends over the inter-layer insulator 8 and within the pixel electrode via hole, so that a part of the pixel electrode 9 is contact directly with the part of the upper surface of the lead portion of the source electrode 6, whereby the source electrode 6 is electrically connected to the pixel electrode 9. The pixel electrode 9 also extends over an upper surface of the inter-layer insulator 8. The pixel electrode 9 comprises a transparent material, typically, indium tin oxide (ITO) or indium zinc oxide (IZO).

The novel thin film transistor shown in FIGS. 12 and 13 may be fabricated as follows. FIGS. 14A through 14G are fragmentary cross sectional elevation views of the novel channel-etch thin film transistors in sequential steps involved in a novel fabrication process for fabricating the transistor shown in FIGS. 12 and 13.

Figure 14A:
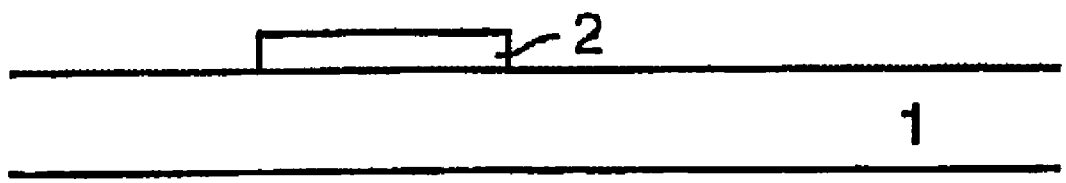
FIGS. 14A through 14G are fragmentary cross sectional elevation views of the novel channel-etch thin film transistors in sequential steps involved in a novel fabrication process for fabricating the transistor shown in FIGS. 12 and 13.

With reference to FIG. 14A, a gate electrode layer of chromium (Cr) is deposited on a clean surface of a glass substrate 1 by a sputtering method. The gate electrode layer is then patterned to form a gate electrode 2 over the glass substrate 1.

Figure 14B:
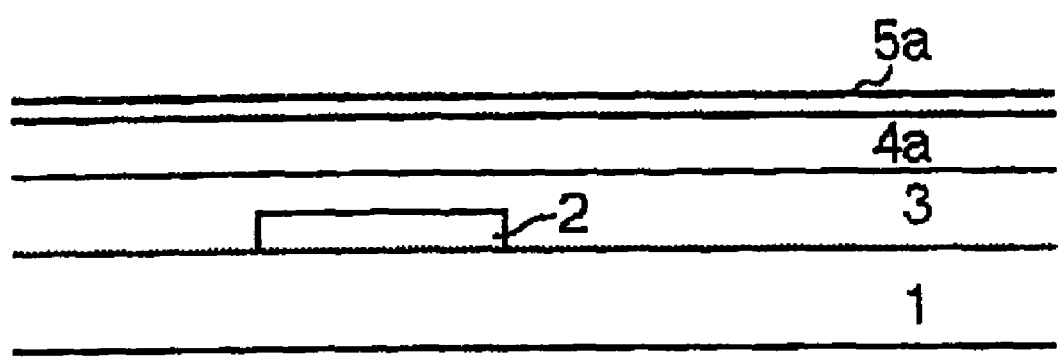

With reference to FIG. 14B, sequential plasma enhanced chemical vapor deposition processes are taken place, so that a gate insulation film 3 of $SiN_x$ is deposited over the gate electrode 2 and the glass substrate 1, and an undoped amorphous silicon layer 4a is deposited on the gate insulation film 3, and further a phosphorous-doped n+-type amorphous silicon layer 5a is deposited on the undoped amorphous silicon layer 4a.

Figure 14C:
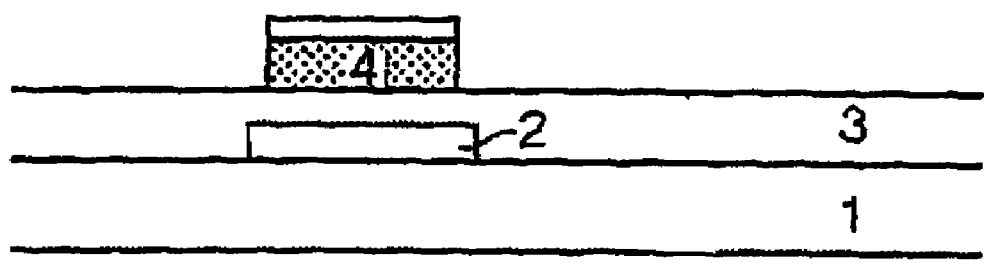

With reference to FIG. 14C, an anisotropic etching process, for example, a dry etching process is taken place to selectively remove the phosphorous-doped n+-type amorphous silicon layer 5a and the undoped amorphous silicon layer 4a, so that a patterned undoped amorphous silicon layer 4 and a patterned phosphorous-doped n+-type amorphous silicon layer 5 remain over the gate electrode 2.

Figure 14D:
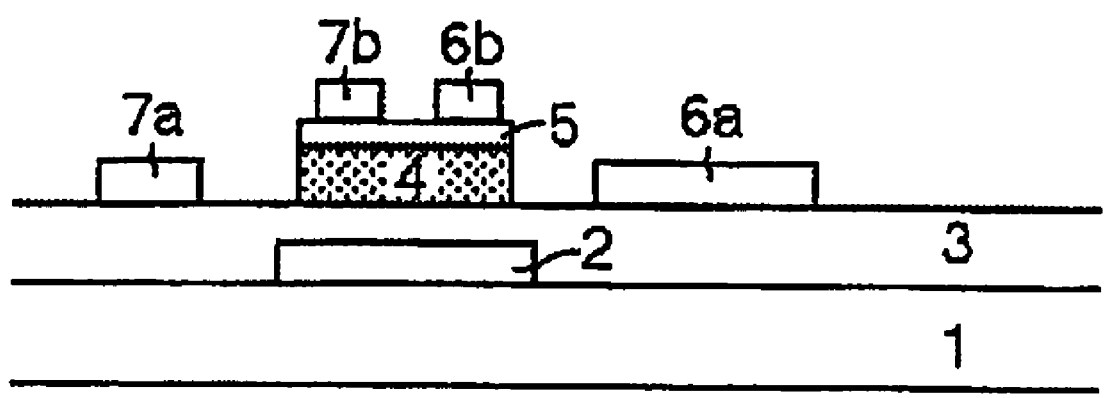

With reference to FIG. 14D, a further sputtering process is carried out to deposit a chromium layer over the phosphorous-doped n+-type amorphous silicon layer 5 and the upper surface of the gate insulation film 3. Subsequently, the chromium layer is selectively removed by an isotropic etching process, for example, a wet etching process to leave the chromium layer on parts of the top surface of the phosphorous-doped n+-type amorphous silicon layer 5 and over parts of the gate insulation film 3, thereby to form electrode primary portions 6b and 7b and first lead portions 6a and 7a of source and drain electrodes 6 and 7, respectively. A center region of the upper surface of the phosphorous-doped n+-type amorphous silicon layer 5 is exposed through a gap between the electrode primary portions of the source and drain electrodes 6 and 7. The first lead portions 6a and 7a of the source and drain electrodes 6 and 7 are distanced from side walls of the undoped amorphous silicon layer 4. Namely, the electrode primary portions 6b and 7b and the first lead portions 6a and 7a of the source and drain electrodes 6 and 7 are formed simultaneously.

Figure 14E:
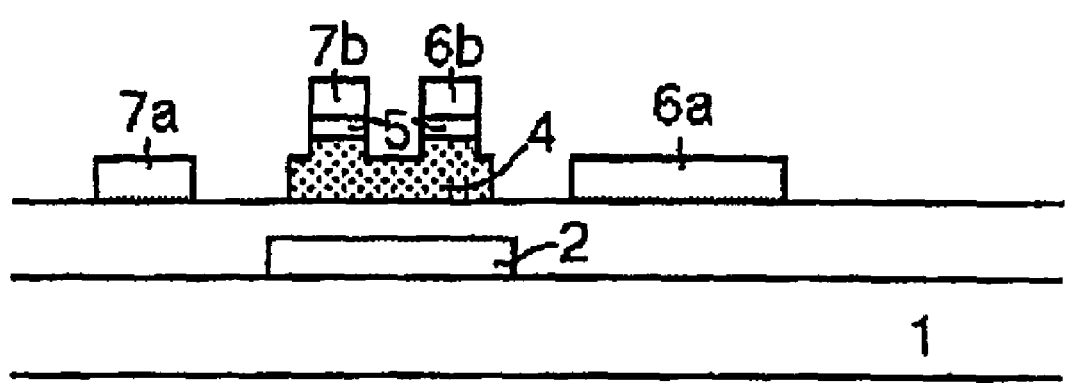

With reference to FIG. 14E, an anisotropic etching process, for example, a dry etching process is carried out by use of the electrode primary portions 6b and 7b and the first lead portions 6a and 7a of the source and drain electrodes 6 and 7 as a mask, so that the phosphorous-doped n+-type amorphous silicon layer 5 under the gap between the electrode primary portions 6b and 7b of the source and drain electrodes 6 and 7 is selectively removed, and further the undoped amorphous silicon layer 4 is also selectively removed. The selectively removed phosphorous-doped n+-type amorphous silicon layer 5 act as phosphorous-doped n+-type amorphous silicon source and drain layers 5, while the selectively removed undoped amorphous silicon layer 4 acts as an active layer 4.

Figure 14F:
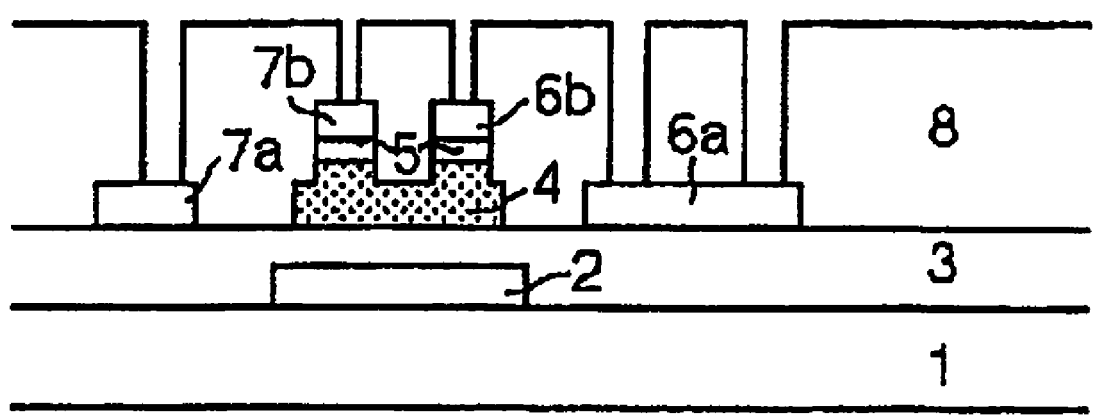

With reference to FIG. 14F, a plasma enhanced chemical vapor deposition process is taken place to form an inter-layer insulator 8 of $SiN_x$ which extends over the gate insulation film 3 and the source and drain electrodes 6 and 7 as well as within the gap between the source and drain electrodes 6 and 7. The inter-layer insulator 8 is then selectively removed to form first and second source via holes and first and second drain via holes and further a pixel electrode via hole, wherein the first source via hole and the pixel electrode via hole are positioned over the first lead portion 6a of the source electrode 6, and the second source via hole is positioned over the electrode primary portion 6b of the source electrode 6. Further, the first drain via hole is positioned over the first lead portion 7b of the drain electrode 7, and the second drain via hole is positioned over the electrode primary portion 7b of the drain electrode 7. The inter-layer insulator 8 is provided to protect the active layer 4.

Figure 14G:
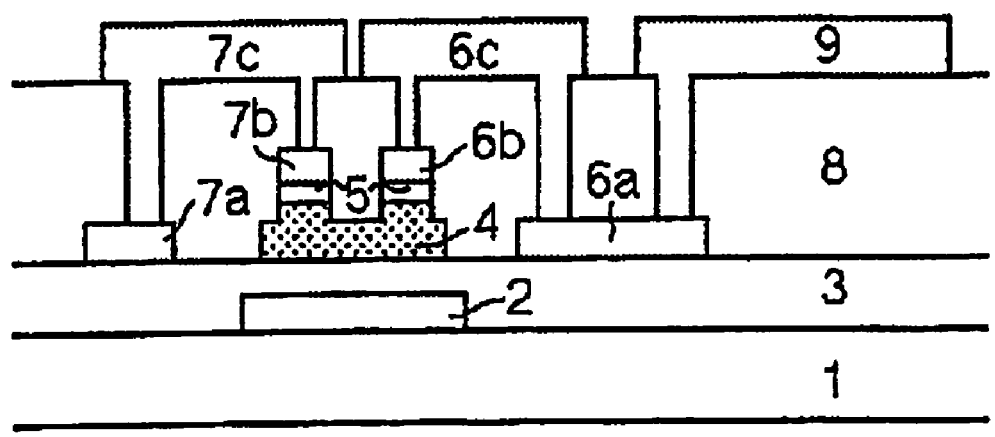

With reference to FIG. 14G, a further more sputtering process is carried out to deposit an indium tin oxide layer over the inter-layer insulator 8 and within the above via holes. The indium tin oxide layer is then selectively removed by an etching process, so that a pixel electrode 9, and second lead portions 6c and 7c of the source and drain electrodes 6 and 7 are formed simultaneously. The pixel electrode 9 is connected through the pixel electrode via hole to a part of the first lead portion 6a of the source electrode 6. The second lead portion 6c of the source electrode 6 is connected through the first source via hole to another part of the first lead portion 6a of the source electrode 6, and also connected through the second source via hole to the electrode primary portion 6b of the source electrode 6. The second lead portion 7c of the drain electrode 7 is connected through the first drain via hole to a part of the first lead portion 7a of the drain electrode 7, and also connected through the second drain via hole to the electrode primary portion 7b of the drain electrode 7. The source electrode 6 comprises the electrode primary portion 6b, the second lead portion 6c connected to the electrode primary portion 6b through the second source via hole, and the first lead portion 6a connected to the second lead portion 6c through the first source via hole, and also connected to the pixel electrode 9 through the pixel electrode via hole. The drain electrode 7 comprises the electrode primary portion 7b, the second lead portion 7c connected to the electrode primary portion 7b through the second drain via hole, and the first lead portion 7a connected to the second lead portion 7c through the first drain via hole.

Each of the source and drain electrodes 6 and 7 is connected to the top surface of the active layer 4 but is separated from the side walls of the active layer 4 by the inter-layer insulator 8, so that each of the source and drain electrodes 6 and 7 has no side contact area in contact with the side walls of the active layer 4. Namely, it may be considered that the each of the source and drain electrodes 6 and 7 has zero width of the side contact lead part in contact directly with the side wall of the active layer 4. No side contact area causes no leakage of current through the side walls of the active layer 4, namely a largely-reduced light-off leak current.

It is preferable that the second lead portions 6c and 7c of the source and drain electrodes 6 and 7 may comprise a transparent material, for example, indium tin oxide (ITO) and indium zinc oxide (IZO), which is the same as the material of the pixel electrode 9, so that the second lead portions 6c and 7c and the pixel electrode 9 are simultaneously formed in the common deposition and subsequent patterning processes as described above with reference to FIG. 14G. The above-described sequential fabrication processes for forming the thin film transistor with the second lead portions 6c and 7c of the transparent conductive material are different from the conventional fabrication processes shown in FIGS. 3A through 3G but only in the etching mask pattern for selectively etching the chromium layer in the step of FIG. 14D, and in another etching mask pattern for forming the via holes in the inter-layer insulator 8. This makes it possible to obtain the desired reduction of the light-off leak current without dropping the manufacturing throughput of the thin film transistor.

In general, however, the transparent conductive materials tend to have poor adhesions with the source and drain layers 5, which makes it difficult to obtain a desired good contact characteristic. For improving the adhesion between the transparent conductive material and the source and drain layers 5, it is effective to interpose the electrode primary portions 6b and 7b, which are made of a metal, between the second lead portions 6c and 7c, which are made of the transparent conductive material. Namely, in view of improving the adhesion, it is preferable that the electrode primary portions 6b and 7b are made of a metal.

If the electrode primary portions 6b and 7b are made of a metal, then the electrode primary portions 6b and 7b may be used as an etching mask for taking place an anisotropic etching to the n+-type amorphous silicon layer 5 and the undoped amorphous silicon layer 4. In this case, it is unnecessary to additionally form any further etching mask which is dedicated to carrying out the anisotropic etching. Since the electrode primary portions 6b and 7b of the metal and the first lead portions 6a and 7a are formed in the same or common processes for deposition of chromium and subsequent selective removal thereof. The number of the necessary steps for the novel fabrication processes shown in FIGS. 14A through 14G is the same as the number of the necessary steps for the conventional fabrication processes shown in FIGS. 3A through 3G.

The second lead portions 6c and 7c, which are positioned over the thin film transistor, may comprise the transparent conductive material, thereby causing no reflection of the back-light toward the thin film transistor, and no incidence of the back-light. As a result, a desired further reduction of the light-off leak current can be obtained.

Alternatively, metal materials such as Cr, Al, Mo and Ti may be used for the second lead portions 6c and 7c, which are positioned over the thin film transistor. In this case, the second lead portions 6c and 7c, which are made of a metal material, need to be formed by a different or separate process step from the process step for forming the pixel electrode 9 which is made of the transparent conductive material. Namely, it is necessary to take place additional process steps for forming the second lead portions 6c and 7c, which are made of the metal material. For example, the second lead portions 6c and 7c may be formed by a sputtering process for deposition of the metal material and subsequent patterning the same. The metal-sputtering process may be carried out in a low temperature range of a room temperature to about 150° C., which is lower than the temperature of the heat treatment for forming the side wall insulation films on the side walls of the active layer disclosed in Japanese laid-open patent publication No. 7-273333 and by Y. E. Chen et al. in Technical Report Of IEICE EID98-216 (March 1999) mentioned above. The deposition time for depositing the metal layer in the sputtering process is short, for example, about a few minutes. Thus, the additional step for forming the second lead portions 6c and 7c, which are made of the metal material, causes substantially no reduction of the manufacturing throughput. The second lead portions 6c and 7c, which are made of the metal material, causes a reduction of the resistance value of the source and drain electrodes 6 and 7, which is suitable for driving the thin film transistor with a low driving voltage.

Figure 15:
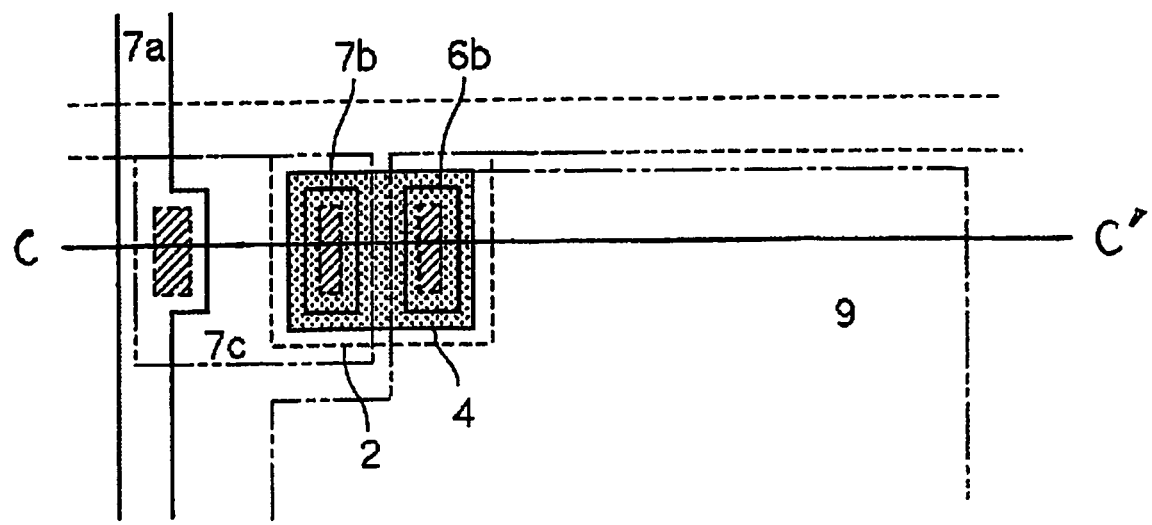
FIG. 15 is a fragmentary plan view of a novel channel-etch thin film transistor with improved source and drain electrodes in accordance with a first modification to the second embodiment of the present invention.
Figure 16:
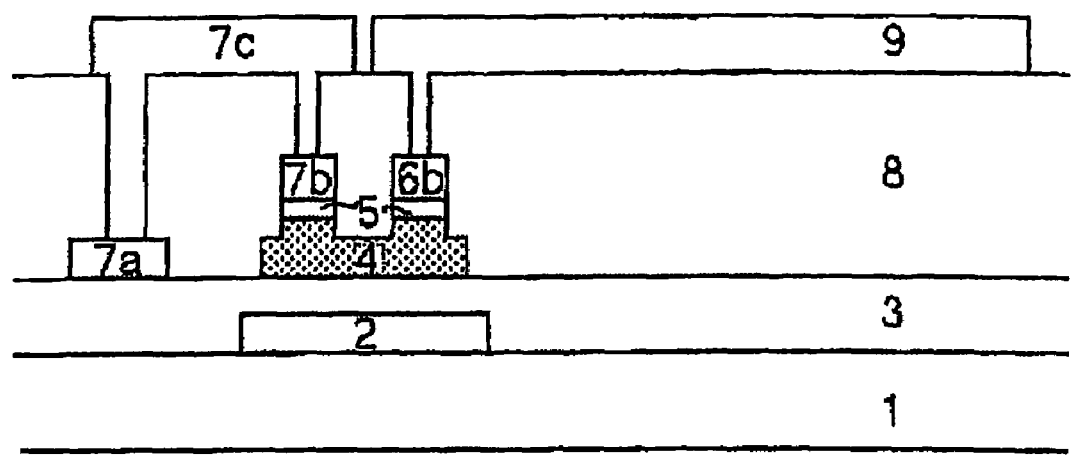
FIG. 16 is a fragmentary cross sectional elevation view taken along a C–C' line of FIG. 15.

FIG. 15 is a fragmentary plan view of a novel channel-etch thin film transistor with improved source and drain electrodes in accordance with a first modification to the second embodiment of the present invention. FIG. 16 is a fragmentary cross sectional elevation view taken along a C–C' line of FIG. 15. In accordance with this first modification to the second embodiment of the present invention, a structural difference of the thin film transistor shown in FIGS. 15 and 16 in this first modification to the second embodiment from the thin film transistor shown in FIGS. 12 and 13 in the second embodiment is that the source electrode 6 comprises only the electrode primary portion 6b which is connected through the single via hole to the pixel electrode 9 which extends over the inter-layer insulator 8 for obtaining a large aperture efficiency.

In this first modification to the second embodiment, also each of the source and drain electrodes 6 and 7 is connected to the top surface of the active layer 4 but is separated from the side walls of the active layer 4 by the inter-layer insulator 8, so that each of the source and drain electrodes 6 and 7 has no side contact area in contact with the side walls of the active layer 4. Namely, it may be considered that the each of the source and drain electrodes 6 and 7 has zero width of the side contact lead part in contact directly with the side wall of the active layer 4. No side contact area causes no leakage of current through the side walls of the active layer 4, namely a largely-reduced light-off leak current.

Figure 17:
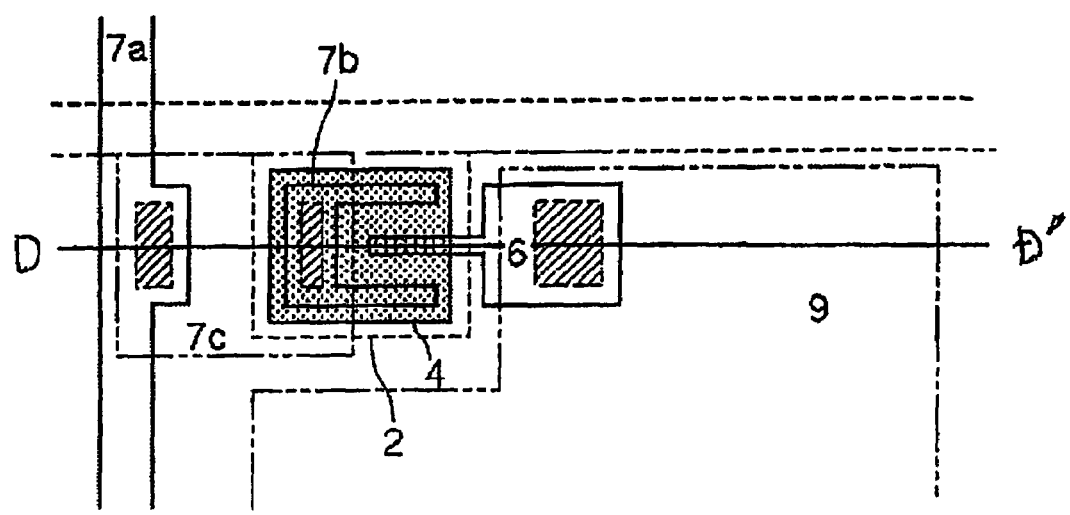
FIG. 17 is a fragmentary plan view of a novel channel-etch thin film transistor with improved source and drain electrodes in accordance with a second modification to the second embodiment of the present invention.
Figure 18:
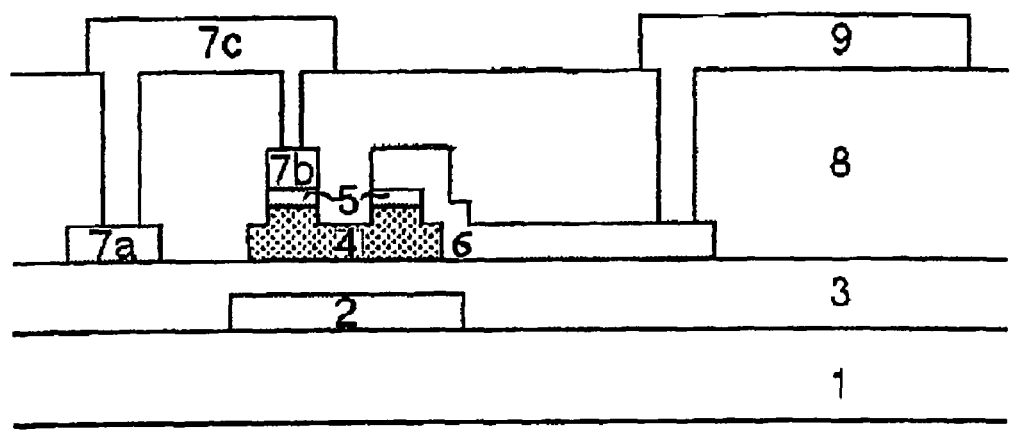
FIG. 18 is a fragmentary cross sectional elevation view taken along a D–D' line of FIG. 17.

FIG. 17 is a fragmentary plan view of a novel channel-etch thin film transistor with improved source and drain electrodes in accordance with a second modification to the second embodiment of the present invention. FIG. 18 is a fragmentary cross sectional elevation view taken along a D–D' line of FIG. 17. In accordance with this second modification to the second embodiment of the present invention, a structural difference of the thin film transistor shown in FIGS. 17 and 18 in this second modification to the second embodiment from the thin film transistor shown in FIGS. 12 and 13 in the second embodiment is that the electrode primary portion 7b of the drain electrode 7 has the same pattern as the above-described pattern in the fourth modification to the first embodiment and as shown in FIG. 11, and the entirety of the source electrode 6 comprises the same structure as the source electrode 6 in the fourth modification to the first embodiment and as shown in FIG. 11.

In this second modification to the second embodiment, the drain electrode 7 is connected to the top surface of the active layer 4 but is separated from the side walls of the active layer 4 by the inter-layer insulator 8, so that the drain electrode 7 has no side contact area in contact with the side walls of the active layer 4. Namely, it may be considered that the drain electrode 7 has zero width of the side contact lead part in contact directly with the side wall of the active layer 4.

In contrast to the above second embodiment and the first modification thereto, a modified shape or pattern of the electrode primary portions of the source and drain electrodes 6 and 7 in this fourth modification is asymmetrical as shown in FIG. 17. The electrode primary portion, which is positioned over the active layer 4, of the source electrode 6 has a smaller area than that of the electrode primary portion 7b, which is positioned over the active layer 4, of the drain electrode 7, in order to reduce a parasitic capacitance of the source electrode 6. The reduction in parasitic capacitance of the source electrode 6 improves a writing performance of the thin film transistor. In order to obtain a good contact characteristic of the source electrode 6, it is preferable that the electrode primary portion, which is positioned over the active layer 4, of the source electrode 6 has a sufficient length in the first horizontal direction. As shown in FIG. 17, the electrode primary portion of the source electrode 6 has a sufficiently narrow width. The side-contact lead part of the source electrode 6 may have the same narrow width as the electrode primary portion thereof. Namely, the side-contact lead part and the electrode primary portion of the source electrode 6 have a uniform and narrow width. The narrow width of the side-contact lead part of the source electrode 6 reduces the side contact area between the side-contact lead part of the source electrode 6 and the side wall of the active layer 4, whereby the reduced side-contact area suppresses an undesired leakage of current through the side wall of the active layer 4.

Consequently, no side contact area in the drain side and the reduced side contact area in the source side cause a greatly reduced leakage of current through the side walls of the active layer 4, namely a greatly-reduced light-off leak current.

The above-described structures and materials for the respective constitutional elements of the thin film transistors are mere typical examples, but available structures and materials should not be limited thereto. For example, in addition to chromium, other metals such as aluminum, molybdenum, tungsten, titanium and tantalum are also available for the gate electrode material. Silicon oxide ($SiO_x$) and silicon nitride oxide ($SiO_xN_y$) are also available for the gate insulation film and the inter-layer, insulator. In addition to the amorphous silicon, microcrystal silicon and polycrystal silicon are also available for the active layer. The above described novel thin film transistors may be applicable to a semi-transmission liquid crystal display.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A channel-etch thin film transistor comprising:
   a gate electrode over a substrate;
   a gate insulation film extending over said gate electrode and said substrate;
   an active layer including a channel region over said gate insulation film;
   a source region and a drain region on said active layer;
   a source electrode connected with said source region, and said source electrode including a source electrode primary portion in contact with said source region and a source electrode lead portion extending from said source electrode primary portion; and
   a drain electrode connected with said drain region, and said drain electrode including a drain electrode primary portion in contact with said drain region and a drain electrode lead portion extending from said drain electrode primary portion,
   wherein at least one of said source electrode and said drain electrode is separated from a side wall of said active layer by an inter-layer insulator, said at least one of said source electrode and said drain electrode including a first lead part extending over said inter-layer insulator and a second lead part extending under said inter-layer insulator and over said gate insulation film, wherein said second lead part is in contact with said gate insulation film.

2. The channel-etch thin film transistor as claimed in claim 1, wherein at least one of said source electrode primary portion and said drain electrode primary portion has a wide region which has the same width as respective end portion of said at least one of said source electrode primary portion and said drain electrode primary portion and a length of at least 3 micrometers along a channel length direction.

3. The channel-etch thin film transistor as claimed in claim 1, wherein a peripheral edge of said gate electrode is positioned outside of a peripheral edge of said active layer in plan view.

4. The channel-etch thin film transistor as claimed in claim 1, wherein said substrate comprises a glass substrate of a liquid crystal display, and said source electrode is connected to a pixel electrode, and said drain electrode is connected to a data line.

5. The channel-etch thin film transistor as claimed in claim 1, wherein both of said source electrode and said drain electrode are separated from side walls of said active layer by an inter-layer insulator.

6. The channel-etch thin film transistor as claimed in claim 5, wherein said source electrode lead portion comprises:
  a first source lead part extending over said inter-layer insulator and being connected through a first via hole to said source electrode primary portion; and
  a second source lead part extending under said inter-layer insulator and over said gate insulation film and being connected through a second via hole to said first source lead part and also being connected through a third via hole to a pixel electrode, and
wherein said drain electrode lead portion comprises:
  a first drain lead part extending over said inter-layer insulator and being connected through a fourth via hole to said drain electrode primary portion; and
  a second drain lead part extending under said inter-layer insulator and over said gate insulation film and being connected through a fifth via hole to said first drain lead part and also being connected to a data line.

7. The channel-etch thin film transistor as claimed in claim 6, wherein each of said first source lead part and said first drain lead part comprises a transparent and electrically connective material.

8. The channel-etch thin film transistor as claimed in claim 7, wherein each of said source electrode primary portion and said drain electrode primary portion comprises a metal.

9. The channel-etch thin film transistor as claimed in claim 5, wherein said source electrode lead portion comprises:
  a first via contact which connects said source electrode primary portion to a pixel electrode extending over said inter-layer insulator, and
wherein said drain electrode lead portion comprises:
  a first drain lead part extending over said inter-layer insulator and being connected through a fourth via hole to said drain electrode primary portion; and
  a second drain lead part extending under said inter-layer insulator and over said gate insulation film and being connected through a fifth via hole to said first drain lead part and also being connected to a data line.

10. The channel-etch thin film transistor as claimed in claim 9, wherein said first drain lead part comprises a transparent and electrically connective material.

11. The channel-etch thin film transistor as claimed in claim 10, wherein each of said source electrode primary portion and said drain electrode primary portion comprises a metal.

12. The channel-etch thin film transistor as claimed in claim 1, wherein one of said source electrode and said drain electrode is separated from side walls of said active layer by an inter-layer insulator.

13. The channel-etch thin film transistor as claimed in claim 12, wherein said drain electrode is separated from side walls of said active layer by the inter-layer insulator and said source electrode lead portion has a side-contact portion in contact directly with a side wall of said active layer, and
wherein said drain electrode lead portion comprises:
  a first drain lead part extending over said inter-layer insulator and being connected through a fourth via hole to said drain electrode primary portion; and
  a second drain lead part extending under said inter-layer insulator and over said gate insulation film and being connected through a fifth via hole to said first drain lead part and also being connected to a data line.

14. The channel-etch thin film transistor as claimed in claim 13, wherein said source electrode primary portion is narrower than said drain electrode primary portion, and said side-contact portion of said source electrode has a width narrower than or equal to said source electrode primary portion.

15. The channel-etch thin film transistor as claimed in claim 13, wherein said first drain lead part comprises a transparent and electrically connective material.

16. The channel-etch thin film transistor as claimed in claim 15, wherein each of said source electrode primary portion and said drain electrode primary portion comprises a metal.

* * * * *